United States Patent
Wagh et al.

(10) Patent No.: US 10,700,642 B2
(45) Date of Patent: *Jun. 30, 2020

(54) GATE DRIVERS FOR STACKED TRANSISTOR AMPLIFIERS

(71) Applicant: pSemi Corporation, San Diego, CA (US)

(72) Inventors: Poojan Wagh, Sleepy Hollow, IL (US); Kashish Pal, Reading (GB); Robert Mark Englekirk, Littleton, CO (US); Tero Tapio Ranta, San Diego, CA (US); Keith Bargroff, San Diego, CA (US); Simon Edward Willard, Irvine, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/240,601

(22) Filed: Jan. 4, 2019

(65) Prior Publication Data

US 2019/0158029 A1  May 23, 2019

Related U.S. Application Data

(60) Continuation of application No. 15/690,115, filed on Aug. 29, 2017, now Pat. No. 10,389,306, which is a (Continued)

(51) Int. Cl.
*H03F 1/22* (2006.01)
*H03F 1/02* (2006.01)
*H03F 3/193* (2006.01)

(52) U.S. Cl.
CPC ......... *H03F 1/0211* (2013.01); *H03F 1/0261* (2013.01); *H03F 1/223* (2013.01); (Continued)

(58) Field of Classification Search
CPC .......................................................... H03F 1/22
(Continued)

(56) References Cited

U.S. PATENT DOCUMENTS 7,248,120 B2    7/2007  Burgener et al.
7,276,976 B2 *  10/2007 Oh .......................... H03F 1/223
                                                                 330/310

(Continued)

OTHER PUBLICATIONS

Nguyen, Patricia T., Notice of Allowance received from the USPTO dated Jul. 15, 2019 for U.S. Appl. No. 16/283,298, 8 pgs.

(Continued)

*Primary Examiner* — Henry Choe
(74) *Attorney, Agent, or Firm* — Jaquez Land Greenhaus LLP; Alessandro Steinfl, Esq.

(57) ABSTRACT

Various methods and circuital arrangements for biasing one or more gates of stacked transistors of an amplifier are possible where the amplifier is configured to operate in at least an active mode and a standby mode. Circuital arrangements can reduce bias circuit and stacked transistors standby current during operation in the standby mode and to reduce impedance presented to the gates of the stacked transistors during operation in the active mode while maintaining voltage compliance of the stacked transistors during both modes of operation.

18 Claims, 15 Drawing Sheets

Related U.S. Application Data division of application No. 15/268,275, filed on Sep. 16, 2016, now Pat. No. 9,843,293.

(52) U.S. Cl.
CPC ......... *H03F 3/193* (2013.01); *H03F 2200/18* (2013.01); *H03F 2200/21* (2013.01); *H03F 2200/451* (2013.01); *H03F 2200/522* (2013.01)

(58) Field of Classification Search
USPC .................................................. 330/311, 310
See application file for complete search history.

(56) References Cited

U.S. PATENT DOCUMENTS

| | | | |
|---|---|---|---|
| 8,779,859 B2* | 7/2014 | Su | H03F 3/193 |
| | | | 330/311 |
| 8,779,860 B2* | 7/2014 | Jeon | H03F 1/223 |
| | | | 330/311 |
| 8,928,415 B2* | 1/2015 | Cha | H03F 3/245 |
| | | | 330/311 |
| 10,181,819 B2 | 1/2019 | Wagh et al. | |
| 10,250,199 B2 | 4/2019 | Klaren et al. | |
| 10,367,453 B2 | 7/2019 | Willard et al. | |
| 10,389,306 B2 | 8/2019 | Wagh et al. | |
| 2004/0245975 A1 | 12/2004 | Tran et al. | |
| 2006/0226910 A1 | 10/2006 | Tanoi | |
| 2007/0075784 A1 | 4/2007 | Pettersson et al. | |
| 2011/0304393 A1 | 12/2011 | Luff | |
| 2012/0139643 A1 | 6/2012 | Scott et al. | |
| 2013/0082782 A1 | 4/2013 | Leuschner et al. | |
| 2014/0171010 A1 | 6/2014 | Olson | |
| 2015/0280655 A1 | 10/2015 | Nobbe et al. | |
| 2016/0126906 A1 | 5/2016 | Maxim et al. | |
| 2016/0241235 A1 | 8/2016 | Hasegawa | |
| 2017/0133989 A1 | 5/2017 | Dykstra et al. | |
| 2018/0262164 A1 | 9/2018 | Ranta et al. | |
| 2019/0158031 A1 | 5/2019 | Klaren et al. | |
| 2019/0190459 A1 | 6/2019 | Wagh et al. | |
| 2019/0379330 A1 | 12/2019 | Willard et al. | |

OTHER PUBLICATIONS

Choe, Henry, Office Action received from the USPTO dated Apr. 12, 2018 for U.S. Appl. No. 15/690,115, 18 pgs.

Choe, Henry, Notice of Allowance received from the USPTO dated Dec. 18, 2018 for U.S. Appl. No. 15/690,115, 31 pgs.

pSEMI Corporation, Response filed in the USPTO dated May 9, 2018 for U.S. Appl. No. 15/690,115, 10 pgs.

Wienema, David, International Preliminary Report on Patentability received from the EPO dated Jan. 4, 2019 for appl. No. PCT/US2016/057052, 39 pgs.

Pornpromlikit, et al., "A Watt-Level Stacked-FET Linear Power Amplifier in Silicon-on-Insulator CMOS", IEEE Transactions on Microwave Theory and Techniquea, IEEE Service Center, vol. 58, No. 1, Jan. 1, 2010, pp. 57-64.

Kurzbauer, Werner, International Preliminary Report on Patentability received from the EPO dated Jan. 3, 2019 for appl. No. PCT/US2017/050839, 7 pgs.

Mottola, Steven J., Notice of Allowance received from the USPTO dated Mar. 13, 2019 for U.S. Appl. No. 15/839,648, 13 pgs.

Mottola, Steven J., Office Action received from the USPTO dated Dec. 5, 2019 for U.S. Appl. No. 16/453,287, 22 pgs.

Mottola, Steven J., Notice of Allowance received from the USPTO dated Mar. 19, 2020 for U.S. Appl. No. 16/453,287, 9 pgs.

Nguyen, Patricia T., Notice of Allowance received from the USPTO dated Apr. 16, 2020 for U.S. Appl. No. 16/250,889, 47 pgs.

\* cited by examiner

GATE DRIVERS FOR STACKED TRANSISTOR AMPLIFIERS

CROSS REFERENCE TO RELATED APPLICATIONS—CLAIM OF PRIORITY

This application is a continuation of, and claims the benefit of priority under 35 USC § 120 or 35 USC § 121 of, commonly assigned and co-pending prior U.S. application Ser. No. 15/690,115, filed Aug. 29, 2017, "Gate Drivers for Stacked Transistor Amplifiers"; U.S. application Ser. No. 15/690,115 is a divisional of, and claims the benefit of priority under 35 USC § 120 or 35 USC § 121 of, commonly assigned prior U.S. application Ser. No. 15/268,275, filed Sep. 16, 2016, "Gate Drivers for Stacked Transistor Amplifiers" (now U.S. Pat. No. 9,843,293 issued Dec. 12, 2017); the present application is related to U.S. application Ser. No. 15/268,297 entitled "Standby Voltage Condition for Fast RF Amplifier Bias Recovery" filed on Sep. 16, 2016 (now U.S. Pat. No. 9,837,965 issued Dec. 5, 2017), the disclosure of which is incorporated herein by reference in its entirety; the present application is also related to U.S. application Ser. No. 15/268,229 (pending) entitled "Cascode Amplifier Bias Circuits" filed on Sep. 16, 2016, the disclosure of which is incorporated herein by reference in its entirety; the present application is also related to U.S. application Ser. No. 15/268,257 entitled "Body Tie Optimization for Stacked Transistor Amplifier" filed on Sep. 16, 2016 (now U.S. Pat. No. 9,882,531 issued Jan. 30, 2018), the disclosure of which is incorporated herein by reference in its entirety.

The present application may be related to U.S. Pat. No. 7,248,120, issued on Jul. 24, 2007, entitled "Stacked Transistor Method and Apparatus", the disclosure of which is incorporated herein by reference in its entirety; the present application may be related to issued U.S. Pat. No. 9,716,477 issued Jul. 25, 2017, entitled "Bias Control for Stacked Transistor Configuration", the disclosure of which is incorporated herein by reference in its entirety; the present application may also be related to issued U.S. Pat. No. 9,667,195 issued May 30, 2017, entitled "Amplifiers Operating in Envelope Tracking Mode or Non-Envelope Tracking Mode", the disclosure of which is incorporated herein by reference in its entirety; the present application may also be related to issued U.S. Pat. No. 9,413,298 issued Aug. 9, 2016, entitled "Amplifier Dynamic Bias Adjustment for Envelope Tracking", the disclosure of which is incorporated herein in its entirety; the present application may also be related to U.S. Pat. No. 9,219,445 entitled "Optimization Methods for Amplifiers with Variable Supply Power", issued Dec. 22, 2015, the disclosure of which is incorporated herein by reference in its entirety; the present application may also be related to U.S. Pat. No. 8,487,706 B2 entitled "Stacked Linear Power Amplifier with Capacitor Feedback and Resistor Isolation", issued Jul. 16, 2013, the disclosure of which is incorporated herein by reference in its entirety.

BACKGROUND

1. Field

The present application relates to amplifiers. In particular the present application relates to gate biasing for amplifiers comprising stacked transistors which can operate in an active mode during periods of RF signal transmission, and in a standby mode during periods of non-transmission.

2. Description of Related Art

In recent years, stacked cascode amplifiers, which use a plurality of transistors arranged as a stack (stacked transistors) in an amplification stage of the amplifiers, have become predominant in radio frequency (RF) applications where high power, high voltage outputs are desired. Due to the higher number of transistors in the stack, voltage handling performance of the amplifier is increased, thereby allowing the high power, high voltage outputs. Since the stacked transistors comprise individual low voltage transistors which can tolerate a voltage substantially lower than the output voltage of the amplifier, it is important to bias the low voltage transistors of the stack so as to maintain operation within their tolerable voltage range. Such voltage compliance of the low voltage transistors of the stack must be maintained whether the amplifier operates in an active mode, transmitting a signal, or in a standby mode, not transmitting a signal. However, conflicting characteristics of a biasing circuit that provides biasing voltages to the staked transistors may exist between operation in the active mode and in the standby mode, such as, for example, an impedance presented to the gates of the transistors of the stack during the active mode of operation, and a power consumed in the biasing circuit and in the stacked transistors during the standby mode of operation.

SUMMARY

The various teachings according to the present disclosure describe biasing circuits for providing biasing voltages of the stacked transistors that have different characteristics between the active mode and the standby mode, while maintaining voltage compliance of the low voltage transistors of the stack for safe operation in both modes of operation and reducing overall leakage current in the standby mode.

According to a first aspect of the present disclosure, a circuital arrangement is presented, the circuital arrangement comprising: a transistor stack configured to operate as an amplifier, the transistor stack comprising a plurality of stacked transistors comprising an input transistor and an output transistor; the transistor stack configured to operate between a first supply voltage coupled to the output transistor and a reference voltage coupled to the input transistor; a resistive ladder network comprising a plurality of series connected resistors coupled between a second supply voltage and the reference voltage, the resistive ladder network defining gate bias voltage nodes between any two connected resistors of the series connected resistors; one or more switching impedance elements, each coupled between one or more gate bias voltage nodes of the gate bias voltage nodes and a gate of a transistor of the plurality of stacked transistors except the input transistor, wherein the circuital arrangement is configured to operate in at least a first mode and a second mode, wherein during operation in the first mode, the each switching impedance element presents a first impedance to the gate of the transistor, and during operation in the second mode, the each switching impedance element presents a second impedance, larger than the first impedance, to the gate of the transistor, and wherein during operation in the first mode and in the second mode, the each switching impedance element presents a gate bias voltage at the one or more gate bias voltage nodes to the gate of the transistor.

According to a second aspect of the present disclosure, a circuital arrangement is presented, the circuital arrangement comprising: a transistor stack configured to operate as an amplifier, the transistor stack comprising a plurality of stacked transistors comprising an input transistor and an output transistor; the transistor stack configured to operate between a first supply voltage coupled to the output transistor and a reference voltage coupled to the input transistor; a first resistive ladder network comprising a plurality of series connected resistors coupled between a second supply voltage and the reference voltage, the resistive ladder network defining low impedance gate bias voltage nodes between any two connected resistors of the first series connected resistors; a second resistive ladder network comprising a plurality of series connected resistors coupled between the second supply voltage and the reference voltage, the resistive ladder network defining high impedance gate bias voltage nodes between any two connected resistors of the second series connected resistors; and one or more switches configured to selectively couple one of the low impedance gate bias voltage nodes and the high impedance gate bias voltage nodes to gates of transistors of the plurality of stacked transistors except the input transistor.

According to a third aspect of the present disclosure, a method for biasing a transistor stack is presented, the method comprising: during a first mode of operation of the transistor stack, coupling gates of transistors of the stack, except an input transistor of the transistor stack, to low impedance nodes; during a second mode of operation of the transistor stack, coupling said gates to high impedance nodes; based on the coupling and the coupling, providing biasing voltages to said gates during both the first and second modes of operation according to a desired voltage distribution of a voltage across the transistor stack.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

Like reference numbers and designations in the various drawings indicate like elements.

DETAILED DESCRIPTION

Throughout the present disclosure, embodiments and variations are described for the purpose of illustrating uses and implementations of inventive concepts of various embodiments. The illustrative description should be understood as presenting examples of the inventive concept, rather than as limiting the scope of the concept as disclosed herein.

Figure 1:
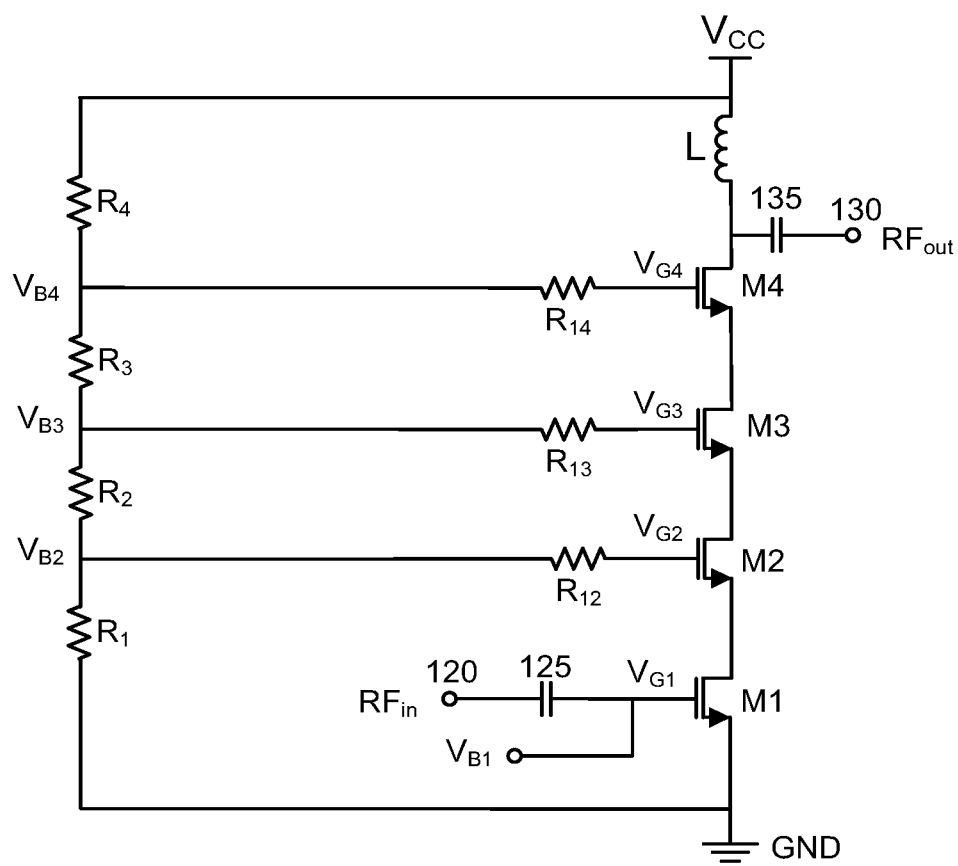
FIG. 1 shows a prior art embodiment of a stacked transistor amplifier where a resistive ladder network is used to provide biasing voltages to the gates of the transistors of the stack.

FIG. 1 shows a simplified schematic of a prior art stacked cascode (RF) amplifier (100). By way of example and not of limitation, the stacked cascode amplifier (100) can comprise a stack of FET transistors (M1, M2, M3, M4) that include an input transistor M1, cascode transistors (M4, M3, M2), and an output transistor M4. An input RF signal, $RF_{in}$, provided at an input terminal (120) of the amplifier (100) is routed to a gate of the input transistor, M1, and is amplified by the amplifier (100). A corresponding amplified output RF signal, $RF_{out}$, is provided at a drain of the output transistor, M4, and routed to an output terminal (130) of the amplifier. Bypass capacitors (125, 135) can be used to decouple low frequency (e.g., DC) biasing voltages provided to the stack of transistors (transistor stack) from the $RF_{in}$ and $RF_{out}$ signals. A supply voltage, $V_{CC}$, is provided to the drain of the output transistor, M4, through an inductor, L, and a reference voltage (e.g., GND) is connected to a source of the input transistor M1. Biasing voltages ($V_{G4}$, $V_{G3}$, $V_{G2}$) at the gates of the cascode transistors (M4, M3, M2) are provided by way of a resistive ladder network (R4, R3, R2, R1) coupled between the supply voltage, $V_{CC}$, and the reference voltage, GND. Nodes ($V_{B4}$, $V_{B3}$, $V_{B2}$) of the resistive ladder network (R4, R3, R2, R1) that connect any two resistors of the resistive ladder network are coupled to respective gates of the cascode transistors (M4, M3, M2) via series resistors (R14, R13, R12) to provide the biasing voltages ($V_{G4}$, $V_{G3}$, $V_{G2}$). As can be seen in FIG. 1, the resistive ladder network (R4, R3, R2, R1) is not used to provide a gate biasing voltage, $V_{G1}$, of the input transistor M1. Instead, a biasing voltage to the input transistor, M1, can be provided at the node $V_{B1}$. Various biasing circuits to generate such gate voltage are described, for example, in the above referenced Published US Application No. 2015/0270806, and Published US Application No. US 2014/0184336 A1.

A person skilled in the art would know that FET transistors (M1, M2, M3, M4) are configured as a four-stage cascode amplifier. Teachings from other documents, such as the above referenced U.S. Pat. No. 8,487,706 B2, further describe stacked cascode amplifiers and methods to minimize output signal distortion by way, for example, of biasing the various gates of the transistors within the stack. The person skilled in the art may use these teaching for further specifics on multi-stage stacked transistors in a cascode configuration, where the stack of FET transistors comprises a number of transistors different from four.

Although the amplifier (100) of FIG. 1 is shown to be powered by a fixed supply voltage $V_{CC}$, other configurations of the amplifier (100) where the supply voltage is variable can also be envisioned. In some exemplary configurations, the supply voltage can be a voltage regulator, or a DC-DC converter. In further exemplary configurations, the supply voltage can vary under control of an external control signal. In some configurations, the control signal can be a function of an envelope signal of the input RF signal, $RF_{in}$, or the output RF signal, $RF_{out}$. Detailed description of biasing methods and apparatus for stacked transistor amplifiers operating from a variable supply voltage can be found, for example, in the above referenced Published US Application No. US 2014/0184336 A1, Published US Application No. 2015/0270806 A1, and U.S. Pat. No. 9,219,445, the disclosures of which are incorporated herein by reference in their entirety. A person skilled in the art would also know of configurations where the supply to the amplifier is in the form of a current source instead of the exemplary voltage source (e.g. $V_{CC}$) discussed in the present disclosure. The teachings according to the present disclosure equally apply to such diverse supply configurations. The exemplary case of a fixed supply discussed in the present disclosure should not be considered as limiting what the applicant considers to be the invention.

Although N-type MOSFETs are used to describe the embodiments in the present disclosure, a person skilled in the art would recognize that other types of transistors such as, for example, P-type MOSFETs and bipolar junction transistors (BJTs) can be used instead or in combination with the N-type MOSFETs. Furthermore, a person skilled in the art will also appreciate the advantage of stacking more than two transistors, such as three, four, five or more, provide on the voltage handling performance of the amplifier. This can for example be achieved when using non bulk-Silicon technology, such as insulated silicon-on-insulator (SOI) or Silicon-on-Sapphire (SOS) technologies. In general, individual devices in the stack can be constructed using CMOS, silicon germanium (SiGe), gallium arsenide (GaAs), gallium nitride (GaN), bipolar transistors, or any other viable semiconductor technology and architecture known. Additionally, different device sizes and types can be used within the stack of devices.

The present disclosure describes methods and arrangements for biasing stacked transistor amplifiers, where the amplifiers are configured to operate in an active mode to transmit an RF signal and in standby mode where no signal is transmitted. Such amplifiers may be used within mobile handsets for current communication systems (e.g. WCMDA, LTE, WiFi, etc.) wherein amplification of signals with frequency content of above 100 MHz and at power levels of above 50 mW is required. Such amplifiers may also be used to transmit power at frequencies and to loads as dictated by downstream splitters, cables, or feed network(s) used in delivering cable television service to a consumer, a next amplifier in an RF chain at a cellular base station; or a beam forming network in a phased array radar system, and other. The skilled person may find other suitable implementations for the present disclosure, targeted at lower (e.g. audio) frequency systems as well, such as audio drivers, high bandwidth laser drivers and similar. As such, it is envisioned that the teachings of the present disclosure will extend to amplification of signals with frequency content of below 100 MHz as well.

With further reference to the amplifier (100) depicted in FIG. 1, the biasing voltages ($V_{G4}$, $V_{G3}$, $V_{G2}$) are such that each transistor (M4, M3, M2, M1) of the stack is biased according to a voltage compliance of the transistor. In other words, a voltage across any two terminals (e.g., gate, source, drain) of the transistor is within a safe operating range of the transistor. As failure of a transistor can be a statistical function of applied voltages across the transistors, even when such voltages are within the safe operating range, in some embodiments it may be desirable to subject the transistors of the stack to same voltage ranges so as to provide an equal life expectancy (e.g., mean time before failure) for each transistor of the stack. Accordingly, the gate biasing voltages ($V_{G4}$, $V_{G3}$, $V_{G2}$) can be configured to evenly distribute the voltage across the transistor stack, $V_{CC}$, amongst the stacked transistors (M4, M3, M2, M1). In other words, a drain to source voltage, $V_{DS}$, of each transistor (M4, M3, M2, M1) of the stack can be made to be substantially equal to a quarter (¼) of the voltage provided by the supply voltage $V_{CC}$. This can be done, for example, as described in the above referenced Published US Application No. 2015/0270806 A1, whose disclosure is incorporated herein by reference in its entirety, by biasing the gates of the transistors (M4, M3, M2) with respective biasing voltages ($V_{G4}$, $V_{G3}$, $V_{G2}$) equal to $V_{CC} \times ¾ + V_{GS}$, $V_{CC} \times ²⁄₄ + V_{GS}$, and $V_{CC} \times ¼ + V_{GS}$. In some alternative embodiments, it may be desirable to distribute the voltage across the transistor stack, $V_{CC}$, according to an unequal distribution, where some of the transistors see a larger $V_{DS}$ drop than others, while maintaining all the $V_{DS}$ of the transistors of the stack within their safe operating ranges. Some exemplary cases of such alternative embodiments are described, for example, in the above referenced Published US Application No. 2015/0270806, whose disclosure is incorporated herein by reference in its entirety, by biasing the gates of the transistors (M4, M3, M2) with respective biasing voltages ($V_{G4}$, $V_{G3}$, $V_{G2}$) equal to $V_{CC} \times K_4 + V_{GS}$, $V_{CC} \times K_3 + V_{GS}$, and $V_{CC} \times K_2 + V_{GS}$, where constants ($K_4$, $K_3$, $K_2$) determined the unequal voltage distribution across the transistors of the stack.

A person skilled in the art would understand that during operation of the amplifier (100), an amplified RF signal at the drain of the output transistor (M4) can be at a voltage level substantially higher than the $V_{CC}$ supply voltage. This means that if the gate voltage $V_{G4}$ of the output transistor M4 is maintained to the biasing voltage level provided by the resistive ladder network (R4, R3, R2, R1) discussed above, and therefore the source of M4 is maintained to, for example, $V_{CC} \times \frac{3}{4} + V_{GS}$, then the drain to source voltage, $V_{DS}$, of the output transistor M4 can be subjected to higher voltage excursions, which can be beyond the tolerable voltage range of the transistor.

Figure 2:
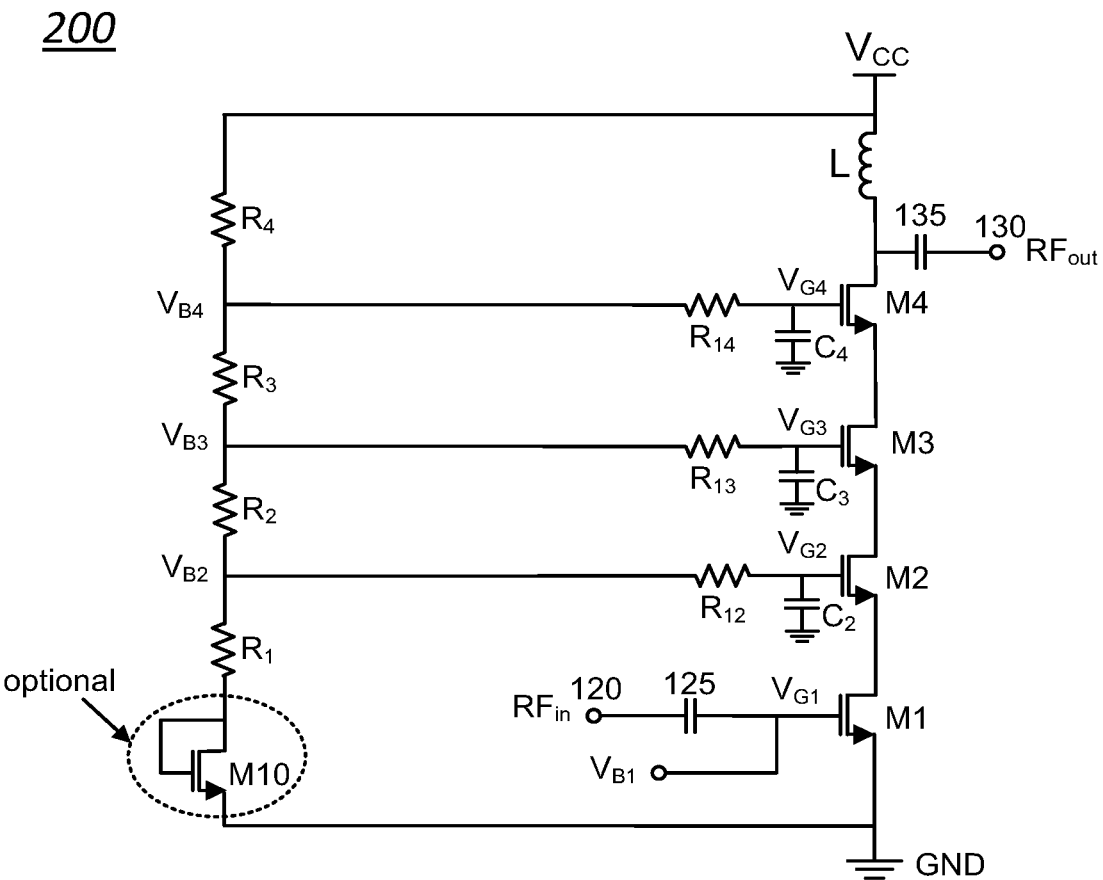
FIG. 2 shows a prior art embodiment of a stacked transistor amplifier similar to the prior art embodiment depicted in FIG. 1, where a diode connected transistor is used to reduce variation of the biasing voltages, and gate capacitors are used to allow voltages at the gates of the transistors of the stack to vary along with an RF signal at the drains of the transistor.

Based on the above, it can be desirable to control the stress on the individual transistors of the stack, due to unequal voltage division of the voltage at the drain of the output transistor M4 across the transistors (M4, M3, M2, M1), which may subject any one of the transistors to a voltage beyond the tolerable voltage range of the transistor (e.g. close to or larger than its limit breakdown voltage). This can be accomplished by configuring the gates of the transistors (M4, M3, M2) of the stack to float via insertion of a gate capacitor ($C_4$, $C_3$, $C_2$) as depicted in FIG. 2. The value of the gate capacitor is chosen so to allow the gate voltage to vary along (float) with the RF signal at the drain of the corresponding transistor, which consequently allows control of the voltage drop (e.g., $V_{DS}$) across the corresponding transistor, thus controlling the conduction of the transistor in accordance to the voltage at its drain, for a more efficient operation of the transistor. Teachings about this floating technique, also referred to as conduction controlling circuit, can be found in the above referenced U.S. Pat. No. 7,248,120, which is incorporated herein by reference in its entirety As the gate capacitors ($C_4$, $C_3$, $C_2$) depicted in FIG. 2 allow coupling of the RF signal at the gates of the transistors (M4, M3, M2), such coupling may negatively influence operation of the biasing circuit provided by the resistive ladder network (R4, R3, R2, R1) as various harmonics of the RF signal, including harmonics at lower frequencies, can alter the operating bias voltages provided by the biasing circuit. As a person skilled in the art would understand, the coupled RF signal, and corresponding harmonics, at a gate of a transistor (e.g., M4, M3, M2) can generate small currents that when fed to an output impedance of the biasing circuit presented to the gate of the transistor, can generate a corresponding voltage at frequencies substantially lower than the frequency of the RF signal. Specifically, if the output impedance of the biasing circuit is large enough, such small currents can generate a large enough low frequency voltage that adds to the biasing voltage to negatively influence operation of the amplifier. As the output impedance of the biasing circuit is a function of resistance values of the resistors (R4, R3, R2, R1), reducing the effects of the RF coupling in the prior art amplifier (200) depicted in FIG. 2 is performed by choosing such values to be smaller. In turn, such small resistance values of the resistors (R4, R3, R2, R1) can require higher biasing currents from the supply voltage $V_{CC}$ to provide the desired gate biasing voltages for the transistors (M4, M3, M2), as compared to choosing higher resistance values (and being subjected to higher levels of the RF coupling). According to some embodiments the impedance (e.g. resistance) of the biasing circuit presented to the gates of the transistors (M4, M3, M2) is substantially of a same value, although other configurations are also possible where an imbalance in the presented impedances exists.

With continued reference to the amplifier (200) of FIG. 2, the desire to reduce the coupling of the RF signal to the basing circuit that generates the gate biasing voltages of the transistors (M4, M3, M2), can increase power dissipation in the resistive ladder network (R4, R3, R2, R1). Although such increase in power dissipation can provide advantages during an active mode of operation of the amplifier (reduced RF coupling due to lower impedance), no advantages are provided during a standby mode of operation. As the amplifier (200) is not amplifying in the standby mode, no RF signal is present in the transistor stack (M4, M3, M2, M1) and therefore no coupling effect of the RF signal to the biasing circuit exists. However, biasing voltages, whether same or different, to the gates of the transistors (M4, M3, M2) must be maintained during the standby mode of operation of the amplifier (200) so as to maintain operation of the transistors (M4, M3, M2, M1) of the stack within their tolerable voltage ranges.

With further reference to the amplifier (200) of FIG. 2, during the standby mode of operation, a bias current through the stacked transistors (M4, M3, M2, M1) may be removed (equal to a leakage current) by providing, for example, a 0 V bias voltage to the gate of the input transistor M1 at node $V_{B1}$. This turns the transistor M1 in an OFF condition where a small leakage current flows through the transistor. Such leakage current can in turn consume wasted power in the amplifier arrangement (200) of FIG. 2. When switching from the standby mode of operation to the active mode of operation of the amplifier arrangement (200), the input transistor M1 is switched to its ON condition by provision of a bias voltage to the gate of the transistor which is larger than a threshold voltage, Vth, of the transistor. Applicant of the present disclosure has found that such switching can cause a "glitch" in the stack (M1, M2, M3, M4) where associated transient currents disturb operating conditions (e.g., biasing points) of the transistors (M4, M3, M2, M1) during a transition time between the standby mode and the active mode (also called transient response, time during which the biasing points have not settled). Such disturbances, which may be associated with charging and discharging of inherent capacitive structures of the transistors (e.g., gate-to-source and/or gate-to-drain capacitors) due to the transient currents during the transition time, may in turn cause damage to the transistors of the stack by momentarily pushing the transistors outside their safe regions of operation.

It follows that the teachings according to the present disclosure provide methods and apparatus to reduce RF coupling effects to the biasing circuit during an active mode of operation of a stacked transistor amplifier, and reduce power dissipation in the biasing circuit during a standby mode of operation of the stacked transistor amplifier, while providing gate biasing voltages to the gates of the stacked transistors (e.g., M4, M3, M2) in both modes of operation so as to operate the transistors within their respective safe operating conditions. The teachings according to the present disclosure further provide methods and apparatus to maintain safe operating conditions of the transistors of the stack during a transition time of the amplifier between its standby mode and active mode of operation. Finally, such teachings further provide methods and apparatus to reduce the leakage current in the stack (M4, M3, M2, M1) during the standby mode of operation of the amplifier (200).

As can be seen in FIG. 2, an optional diode connected transistor M10 is added to the resistive ladder network (R4, R3, R3, R1) which can allow voltages at the nodes ($V_{B4}$, $V_{B3}$, $V_{B2}$) to track process related variations that may affect characteristics of the transistors (M4, M3, M2, M1). By choosing the diode connected transistor M10 to have a same characteristics as for the transistors (M4, M3, M2, M1), process related variations can equally affect current versus voltage response of the transistors (M10, M4, M3, M2, M1) and therefore allow the voltages at the nodes ($V_{B4}$, $V_{B3}$, $V_{B2}$) to track such process variations. Examples of such process variations include (but are not limited to) threshold voltage, mobility, oxide thickness, etc.

Figure 3:
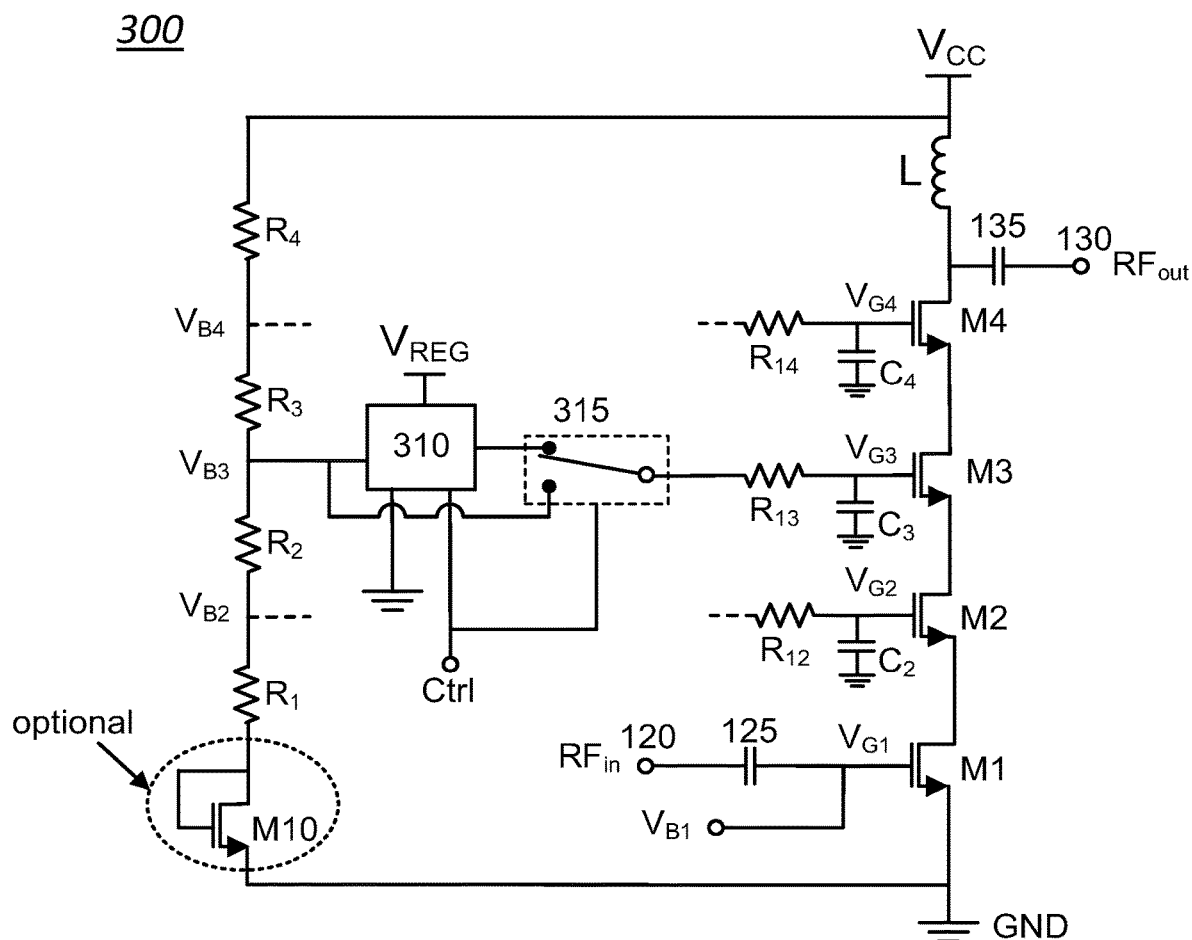
FIG. 3 shows an embodiment according to the present disclosure of a switchable biasing circuit that can switch an impedance presented to the gates of the transistors while maintaining proper biasing of the transistors.

FIG. 3 shows a simplified schematic of a stacked cascode amplifier (300), similar to the amplifier (200) depicted in FIG. 2, which comprises a switchable biasing circuit (e.g., R4, R3, R2, R1, 310, 315) according to an embodiment of the present disclosure that can switch an impedance presented to the gates of the stacked transistors (M4, M3, M2) while maintaining proper biasing of the transistors. It should be noted that for clarity reasons, only one switchable element (310, 315 associated to the gate of the transistor M3) of the switchable biasing circuit of the present disclosure is depicted in FIG. 3, as similar switchable elements (310, 315) can be provided for biasing of the transistors (M4, M2).

The switchable impedance element (310, 315) of FIG. 3 comprises an impedance conversion unit (310) that is coupled, at an input node of the impedance conversion unit (310), to a node, $V_{B3}$, of the resistive ladder network (R4, R3, R2, R1), and optionally, the diode connected transistor M10. The impedance conversion unit (310) is coupled, at an output node of the impedance conversion unit (310), to a first switching node of a switch (315). A second switching node of the switch (315) is coupled to the node $V_{B3}$. A common node of the switch (315) is coupled to the gate of the transistor M3 via the resistor R13. A control signal, Ctrl, selectively controls a conduction path coupled to the common node of the switch (315), between a conduction path including the output node of the impedance conversion unit (310) and a conduction path excluding such output node. The same control signal, Ctrl, can be used to enable and disable operation of the impedance conversion unit (310). According to one exemplary embodiment, when disabled, no current is drained through the impedance conversion unit (310).

In the exemplary configuration depicted in FIG. 3, the position of the switch (315) is such that the common node of the switch (315) couples the gate of the transistor M3 to the output node of the impedance conversion unit (310), therefore presenting a voltage and an impedance at the output node of the impedance conversion unit (310), to the gate of the transistor M3. In an alternate position (not shown) of the switch (315), the common node of the switch (315) couples the gate of the transistor M3 to node $V_{B3}$ of the resistive ladder network (R4, R3, R2, R1), therefore presenting a voltage and an impedance at node $V_{B3}$ to the gate of the transistor M3.

According to an embodiment of the present disclosure, the impedance conversion unit (310) is configured to convert an impedance of the resistive ladder network (R4, R3, R2, R1) presented at the node $V_{B3}$ to a lower impedance at the output node of the impedance conversion unit (310), while maintaining a voltage level at said output node that is substantially the same as the voltage at the node $V_{B3}$ (which is connected to the input node of 310). Accordingly, the voltage presented to the gate of the transistor M3 at the common node of the switch (315) remains constant irrespective of the position of the switch (315), while the impedance presented to the gate of the transistor M3 at the common node of the switch (315) is selectively configured to be either the impedance at node $V_{B3}$, or the lower impedance at the output node of the impedance conversion unit (310). Alternatively, and as shown in FIG. 10C and FIG. 10D (later described), the input node of (310) can be coupled to a node (e.g. $V'_{B3}$ of FIG. 10C, later described) of the resistive ladder network different from a node (e.g. $V_{B3}$ of FIG. 10C, later described) of the resistive ladder network coupled to the second switching node of the switch (315), and therefore allowing to selectively provide two different voltages at the gate of the transistor M3, one presenting a lower impedance and the other a higher impedance to the gate of said transistor.

Based on the above, it follows that the switchable biasing circuit (R4, R3, R2, R1, 310, 315) according to an exemplary embodiment of the present disclosure depicted in FIG. 3, allows maintaining a same biasing voltage to the gate of the transistor M3 while selectively coupling/decoupling an impedance of the resistive ladder network (R4, R3, R2, R1) to/from said gate.

With further reference to the amplifier (300) of FIG. 3, according to an embodiment of the present disclosure, the control signal, Ctrl, can be a digital control signal to control operation of the amplifier (300) in one of the active mode and of the standby mode. Accordingly, for operation of the amplifier (300) in the active mode of operation, the control signal, Ctrl, can control the position of the switch (315) to connect the output node of the impedance conversion unit (310) to the resistor R13, thereby presenting a low impedance and a desired bias voltage to the gate of the transistor M3. Alternatively, for operation of the amplifier (300) in the standby mode of operation, the control signal, Ctrl, can control the position of the switch (315) to connect the node $V_{B3}$ to the resistor R13, thereby presenting a higher impedance and the same desired bias voltage to the gate of the transistor M3. A person skilled in the art would know of many ways to control the cascode stack to operate in one of the active mode and of the standby mode. According to one exemplary embodiment, the control signal, Ctrl, may control a biasing circuit that generates a biasing voltage for the gate of the input transistor M1 at the node $V_{B1}$ to turn OFF the input transistor for operation in the standby mode. As noted above, the referenced Published US Application No. 2015/0270806 whose disclosure is incorporated herein by reference in its entirety describes various biasing methods and apparatus for the input transistor M1.

Since during the active mode of operation of the amplifier (300) of FIG. 3 the gate of the transistor is isolated from the node $V_{B3}$, the impedance at node $V_{B3}$ may not affect coupling of an RF signal at the gate of the transistor M3. In turn this allows choosing the resistance values of the resistors of the resistive ladder network (R4, R3, R2, R1) to be high enough so as to reduce a standby current (power dissipation during the standby mode in the resistive ladder network) in the resistors while providing a desired gate biasing voltage for the transistor M3 (through voltage at the node $V_{B3}$). It follows that the switchable biasing circuit (R4, R3, R2, R1, 310, 315) of the stacked amplifier (300) depicted in FIG. 3 allows maintaining of a desired biasing voltage at the gate of the transistor M3 during both operation modes of the amplifier (300) while presenting a low impedance to said gate for reduced RF coupling effects to the biasing voltages during the active mode of operation, and reducing standby power dissipation in the resistive ladder network. Same effects can be produced via similar switching impedance elements (310, 315) provided for biasing of the gates of the transistors (M2, M4), such as depicted, for example, in FIG. 7 later described.

With further reference to FIG. 3, the impedance conversion unit (310) is configured to provide a high isolation between its input node, connected to node $V_{B3}$, and its output node, connected to the switch (315). Furthermore, as described above, the impedance conversion unit (310) is configured to present a low impedance at its output node, and output a voltage at its output node which is equal to the voltage at its input node ($V_{B3}$). The low impedance provided at the output node of the conversion unit (310) further allows sinking and sourcing of currents large enough to quickly charge/discharge inherent gate-to-drain and gate-to-source capacitors of the transistors (M4, M3, M2) responsive to above mentioned "glitch" during the transition time between standby mode and active mode of operation, and therefore, allowing fast recovery of the biasing conditions in spite of such "glitch". In turn, this allows for a quicker transient response of the amplifier arrangement (time it takes for the biasing conditions to settle) while maintaining the transistors of the stack within their safe conditions of operation during the corresponding transition time. A person skilled in the art would know of many ways to implement such circuit. According to one exemplary embodiment, a source-follower can be used as the impedance conversion unit (310), as shown in FIG. 4A and FIG. 4B.

Figure 4A:
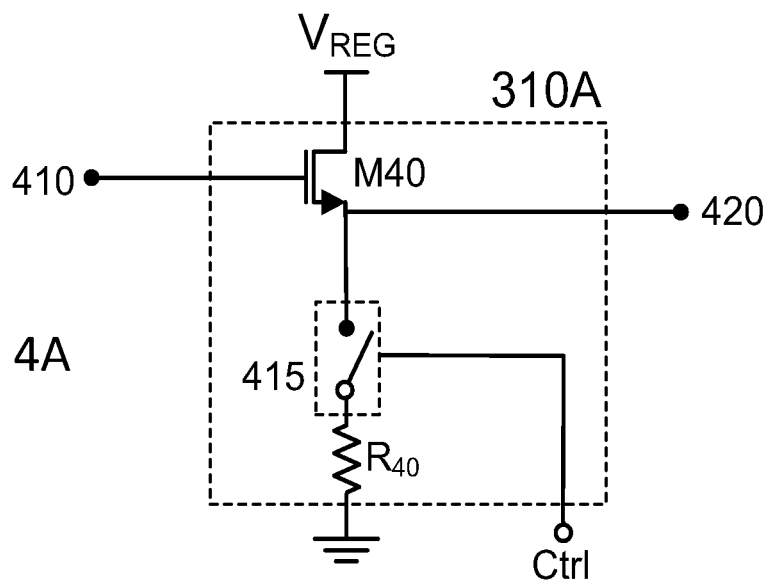
FIG. 4A and FIG. 4B show exemplary embodiments of source-follower transistor circuits used in the switchable biasing circuits of the present disclosure.
Figure 4B:
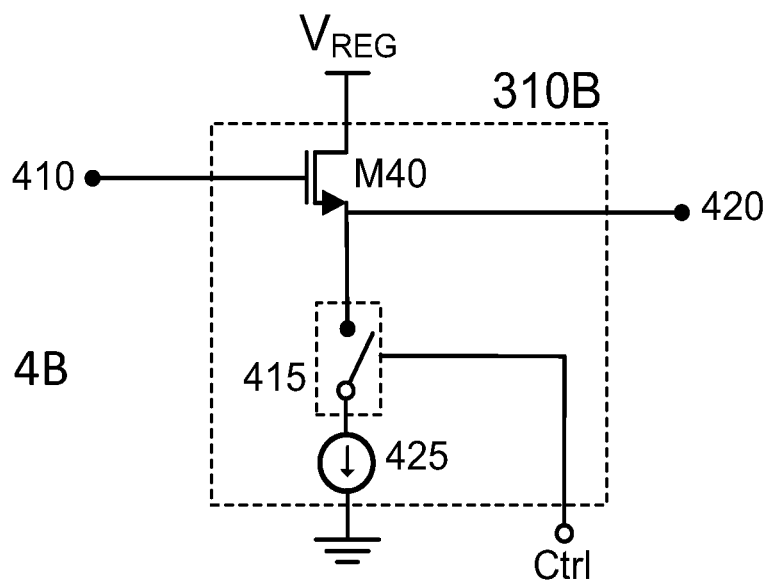

With further reference to the impedance conversion units (310A) and (310B) of FIG. 4A and FIG. 4B, a source-follower circuit can be used to provide functionality of a buffer circuit that buffers nodes ($V_{B4}$, $V_{B3}$, $V_{B2}$) connected at the input node (410), while converting their impedances at the output node (420). Transistor M40 is configured as a source-follower, with a drain of the transistor M40 connected to a supply voltage, $V_{REG}$, and the source of the transistor M40 connected to a current sinking element (R40, 425) by way of a switch (415). In the exemplary embodiment of FIG. 4A, the current sinking element is a resistor (R40) whose size is chosen for a desired current through the transistor M40 which determines an output impedance of the transistor M40, and therefore an output impedance at the output node (420). Furthermore, according to an exemplary embodiment, the transistor M40 can have a low threshold voltage, substantially equal to 0 V, so as gate to source voltage drop of the transistor M40 is substantially equal to 0 V (i.e., $V_{GS}$=0 V). During the active mode of operation of the impedance conversion unit (310A) of FIG. 4A, the switch (415) is closed to allow flow of current through the resistor R40, and during the standby mode of operation the switch (415) is opened to stop current flow, and therefore power consumption through the impedance conversion unit (310A). Operation of the exemplary impedance conversion unit (310B) is similar to the operation of the element (310A) with the difference that a current source (425) is used in lieu of the resistor R40 as a means to sink current through the transistor M40. Due to its inherent smaller physical size as compared to a resistor (e.g., R40), the current source can allow for an overall reduction in the size of the circuit (310B) when compared to the circuit (310A).

With further reference to the impedance conversion units (310A) and (310B) of FIG. 4A and FIG. 4B, the supply voltage, $V_{REG}$, can be a regulated voltage independent from a voltage level of the supply voltage $V_{CC}$, or alternatively can be a function of the supply voltage $V_{CC}$, including $V_{CC}$. A person skilled in the art would realize that a voltage level of $V_{REG}$ must comply to a voltage compliance of the transistor M40 so as to operate the transistor within its tolerable voltage range. As voltages at the nodes ($V_{B4}$, $V_{B3}$, $V_{B2}$) of the resistive ladder network (R4, R3, R2, R1) can be different, depending on a node ($V_{B4}$, $V_{B3}$, $V_{B2}$) coupled to the input node (410) of the impedance conversion unit (310A, 310B), a corresponding level of the supply voltage $V_{REG}$ may be different, as shown in FIG. 7, later described.

Figure 5:
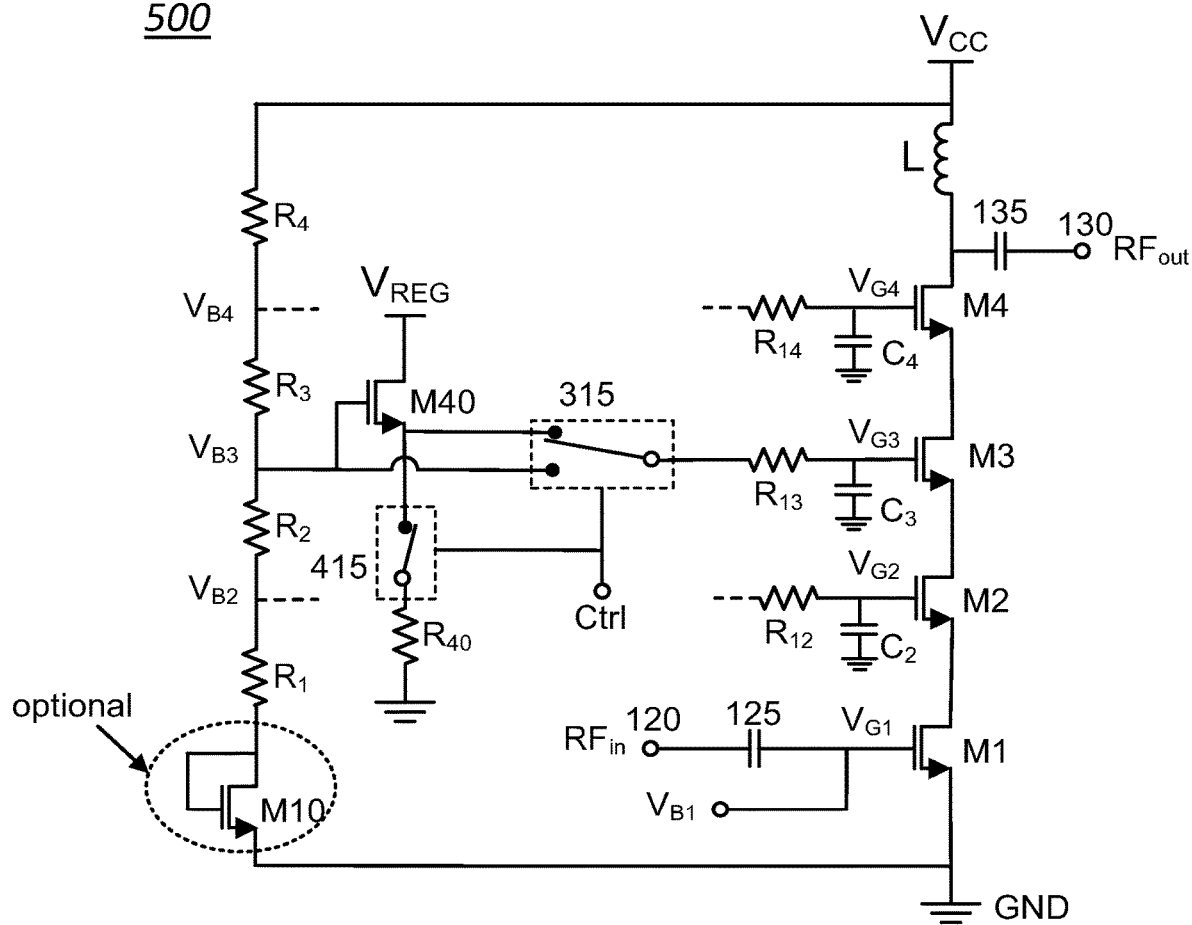
FIG. 5 shows an exemplary embodiment according to the present disclosure of the switchable biasing circuit of FIG. 3 using the exemplary source-follower transistor circuit of FIG. 4A.

FIG. 5 shows a simplified schematic of a stacked cascode amplifier (500) which uses the impedance conversion unit (310A) of FIG. 4A. A person skilled in the art would realize that biasing of the amplifier (500) is according to the switchable biasing discussed with respect to the amplifier (300) of FIG. 3, where the impedance conversion unit (310) of FIG. 3 is replaced by the source-follower configuration (310A) discussed with respect to FIG. 4A. As noted above, for clarity reasons, only one such element (310A) is shown in FIG. 5, as similar elements (310A), that may be powered by different supply voltages, $V_{REG}$, may also be coupled between each of the ($V_{B4}$, $V_{B3}$, $V_{B2}$) nodes of the resistive ladder network (R4, R3, R2, R1) and corresponding gate resistors (R14, R13, R12). As previously noted, the four-stage cascode configuration of the FIG. 5 is just an exemplary embodiment of the present disclosure and should not be conceived as limiting the scope of what the applicant considers to be the invention, as the present teachings equally apply to configurations having different number of stages (e.g., 2, 3, 4, 5, and higher).

Figure 6:
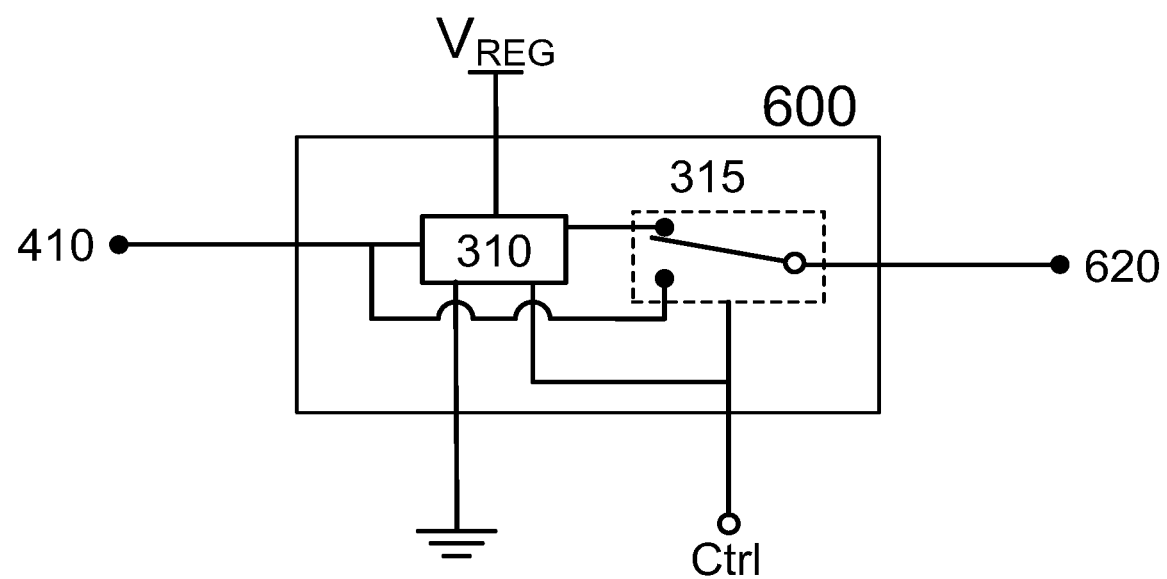
FIG. 6 shows an impedance control element that when coupled to the prior art embodiments depicted in FIG. 1 and FIG. 2 provides functionality of the switchable biasing circuit of the present disclosure depicted in FIG. 3.

With further reference to the switchable biasing circuit (R4, R3, R2, R1, 310, 315) of the present disclosure depicted in FIG. 3, the impedance conversion unit (310) coupled to the switch (315) can be considered as an impedance control element (600) as depicted in FIG. 6. According to the above description, the impedance control element (600) that has the functionality of coupling a voltage at its input node (410) to its output node (620) while selectively changing the impedance at its output node under control of the control signal, Ctrl. In other words, during a first mode of operation (e.g., standby mode), a voltage at the output node (620) equals a voltage at the input node (410), and an impedance at the output node (620) equals the impedance at the input node (410). During a second mode of operation (e.g., active mode), a voltage at the output node (620) equals the voltage at the input node (410), and the impedance at the output node (620) is lower than the impedance at the input node (410). Furthermore, during the first mode of operation, no current is drained by the impedance control element (600), and during the second mode of operation, an isolation between the output node (620) and the input node (410) is high. Given such functionality, it is well within the capabilities of a person skilled in the art to design circuits for usage in the switchable biasing circuit of the present disclosure. Such circuits can use, for example, operational amplifiers or discrete transistors to provide buffering of the voltage at the input node (410) while presenting a different impedance at the output node (620). In other words, the impedance conversion unit (310) of the impedance control element (600) may include anyone or a combination of transistors and operational amplifiers (with or without feedback).

Figure 7:
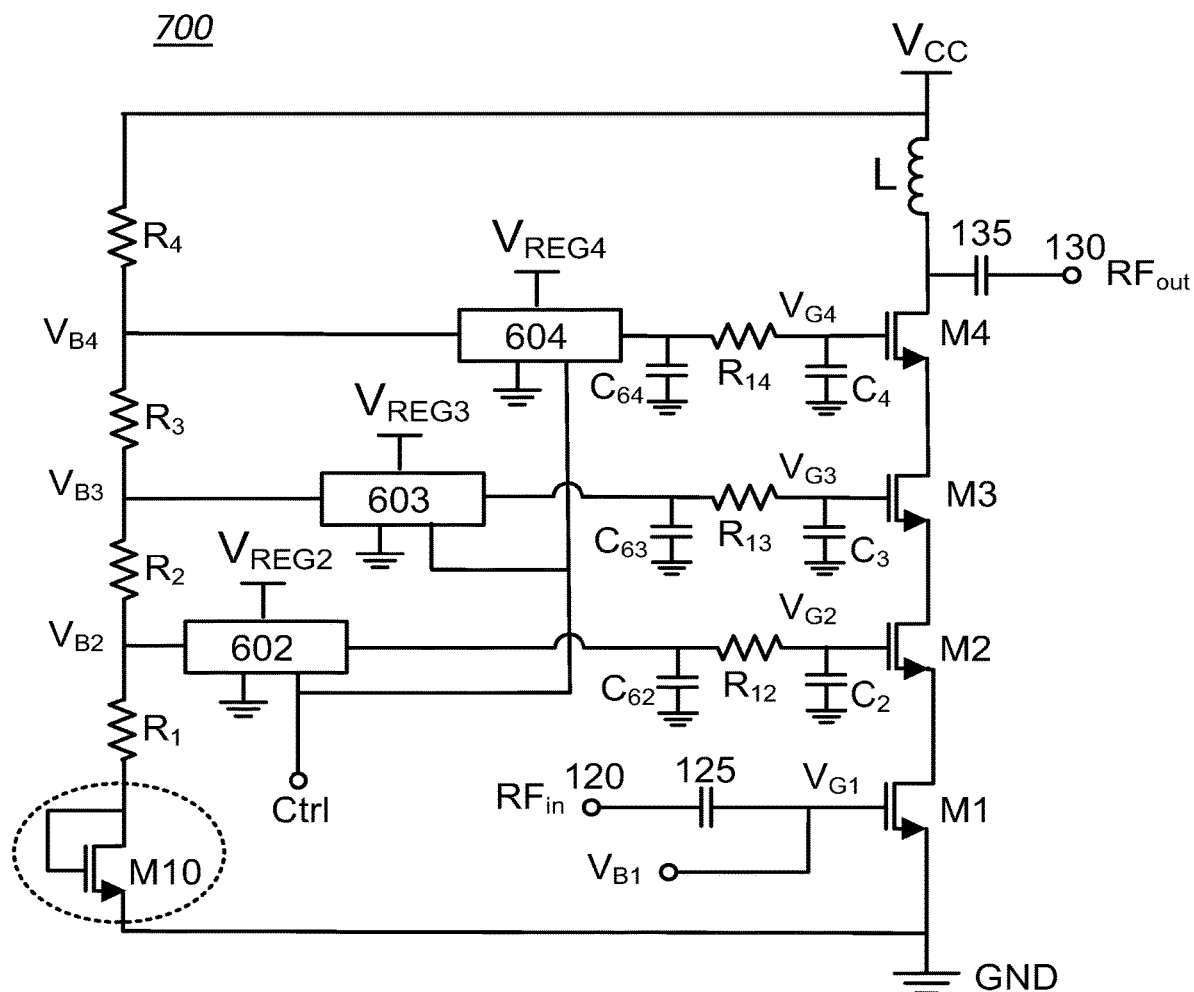
FIG. 7 shows a switchable biasing circuit according to the present disclosure, where a plurality of impedance control elements, similar to the one depicted in FIG. 6, powered by different voltages, are used to each provide a biasing voltage to a different transistor of the stack.

FIG. 7 shows a simplified schematic of a stacked cascode amplifier (700) which comprises a switchable biasing circuit (R4, R3, R2, R1, 602, 603, 604) according to the present teachings. Each of the elements (602, 603, 604) is according to the impedance control element (600) described in relation to FIG. 6. As previously described, each of the impedance control elements (602, 603, 604) may be powered by a different (or same) supply voltage ($V_{REG2}$, $V_{REG3}$, $V_{REG4}$) to allow voltage compliance of constituent electronic elements (e.g., transistors, operational amplifiers). As voltages at the nodes ($V_{B4}$, $V_{B3}$, $V_{B2}$) can follow the expression $V_{B4}$>$V_{B3}$>$V_{B2}$, according to one exemplary embodiment of the present disclosure the supply voltages ($V_{REG2}$, $V_{REG3}$, $V_{REG4}$) can also follow a similar expression, where $V_{REG4}$>$V_{REG3}$>$V_{REG2}$. Operation of the stacked cascode amplifier (700) of FIG. 7 is as described with respect to the operation of the amplifier (300) of FIG. 3. According to an exemplary embodiment, the impedance control elements (602, 603, 604) present a same impedance value to the gates of the transistors (M4, M3, M2) during the active mode of operation of the amplifier (700). Other exemplary embodiments where the impedance control elements (602, 603, 604) present different impedance values to the gates of the transistors (M4, M3, M2) during the active mode of operation of the amplifier (700) may be possible.

With further reference to the amplifier (700) depicted in FIG. 7, optional capacitors ($C_{64}$, $C_{63}$, $C_{62}$) can be used to further isolate the biasing circuit from coupled RF signals at the gates ($V_{G4}$, $V_{G3}$, $V_{G2}$) of the transistors (M4, M3, M2). The combination of such capacitors with the series connected resistors (R14, R13, R12) can create a low pass filter whose cutoff frequency is chosen according to a frequency of operation of the RF signal amplified by the amplifier (700). Although not shown in the other figures of the present disclosure, similar capacitors can be used in any of the presented embodiments.

The switchable biasing circuits according to the present disclosure discussed above can use an impedance conversion unit (e.g., 310 of FIG. 3, FIG. 4A, FIG. 4B, FIG. 6) which comprises active components, such as a transistor M40, as depicted in FIG. 4A, FIG. 4B and FIG. 5, or other active components, such an operational amplifier, as discussed above. An alternate switchable biasing circuit according to a further embodiment can use mainly passive components, such as resistors, for a simpler biasing configuration, as depicted in FIG. 8, while providing the same principles of operation as provided by the above discussed configurations, that is, to reduce RF coupling effects to the biasing circuit during an active mode of operation of the stacked transistor amplifier, and reduce power dissipation in the biasing circuit during a standby mode of operation of the stacked transistor amplifier, while maintaining same gate biasing voltages to the gates of the stacked transistors (e.g., M4, M3, M2) in both modes of operation.

Figure 8:
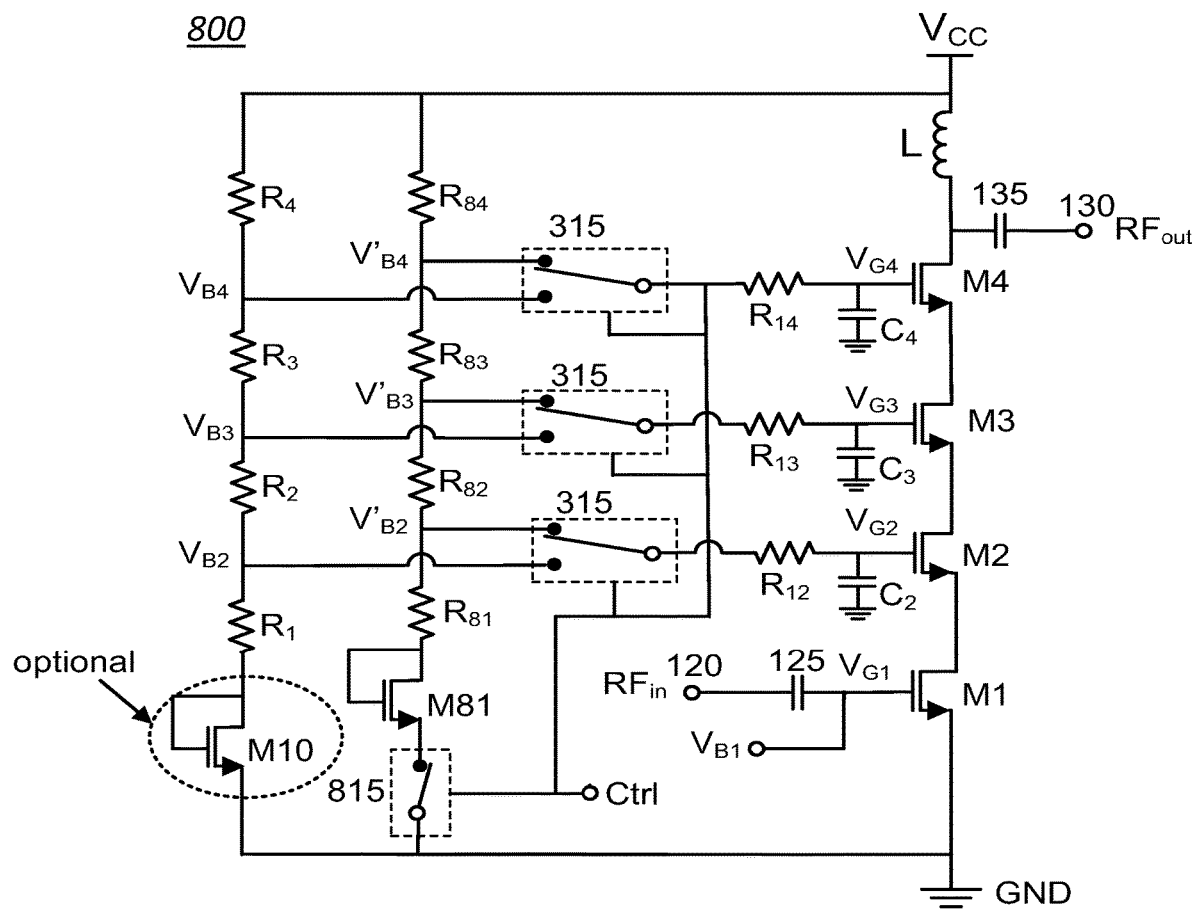
FIG. 8 shows a switchable biasing circuit according to the present disclosure where nodes of two resistive ladder networks provide biasing voltages to transistors of the stack.

With further reference to the amplifier (800) of FIG. 8, two separate resistive ladder networks (R4, R3, R2, R1) and (R84, R83, R82, R81) are used to each provide biasing voltages to the gates of the transistors (M4, M3, M2, M1) by way of node voltages ($V_{B4}$, $V_{B3}$, $V_{B2}$) and ($V'_{B4}$, $V'_{B3}$, $V'_{B2}$). According to some exemplary embodiments of the present disclosure, the two resistive ladders can provide same biasing voltages to the gates of the transistors (M4, M3, M2, M1). According to further exemplary embodiments of the present disclosure, the two resistive ladders can provide different biasing voltages to the gates of the transistors (M4, M3, M2, M1) while maintaining the transistors within their respective safe operating conditions. As discussed above, each ladder can have an optional diode connected transistor (e.g. M10, M81) to allow voltages at the nodes of the ladders to track process related variations of the stacked transistors (M4, M3, M2, M1). An optional switch (815) can be used to control a current conduction path across the resistive ladder networks. It should be further noted that, while the resistive ladder networks (R4, R3, R2, R1) and (R84, R83, R82, R81) in FIG. 8 (and other, later described) are shown connected to the same supply voltage $V_{CC}$, other configurations, such as one depicted in FIG. 10D (later described), where a supply voltage to the resistive ladder networks is different than $V_{CC}$ are also possible.

The resistive ladder network (R4, R3, R2, R1) of FIG. 8 has been described with respect to the previous figures (e.g. FIG. 3) and can include resistance values high enough to reduce a standby current through the ladder. Accordingly, a switch to completely remove a current path through the ladder (similar in operation to switch 815) during the active mode of operation may not be necessary as very little current is expected to conduct through the ladder. In some exemplary embodiments, resistance values of the resistors (R4, R3, R2, R1) can be high enough to allow conduction of a current as small as 3 μA through the ladder. As described above, during the standby mode of operation of the amplifier (800), biasing voltages to the gates of the transistors (M4, M3, M2, M1) are provides by the nodes ($V_{B4}$, $V_{B3}$, $V_{B2}$) of the resistive ladder network (R4, R3, R2, R1), where each such nodes presents a higher impedance to the gates of said transistors. As discussed above, selection of such nodes is provided by the switches (315).

The resistive ladder network (R84, R83, R82, R81) of FIG. 8 divides a voltage (e.g. $V_{CC}$ as shown in FIG. 8) across the ladder to generate voltages at corresponding nodes ($V'_{B4}$, $V'_{B3}$, $V'_{B2}$), which can be substantially equal to or different from the voltages at the nodes ($V_{B4}$, $V_{B3}$, $V_{B2}$), with the difference that each of the nodes ($V'_{B4}$, $V'_{B3}$, $V'_{B2}$) presents an impedance to a gate of a corresponding transistor (M4, M3, M2, M1) which is substantially lower than the impedance presented by a corresponding node ($V_{B4}$, $V_{B3}$, $V_{B2}$) of the resistive ladder network (R4, R3, R2, R1). As described above, this allows reducing coupling effects of the RF signal conducted through the transistors (M4, M3, M2, M1) with respect to the biasing voltages at the nodes ($V'_{B4}$, $V'_{B3}$, $V'_{B2}$). The lower impedance presented by the nodes ($V'_{B4}$, $V'_{B3}$, $V'_{B2}$) is provided by choosing smaller resistance values of the resistors (R84, R83, R82, R81), which is turn allows for a substantially larger current to flow through the resistive ladder network (R84, R83, R82, R81) and for a quicker transient response of the amplifier arrangement (time it takes for the biasing conditions to settle) while maintaining the transistors (M4, M3, M2, M1) of the stack within their safe conditions of operation during a corresponding transition time. During the standby mode of operation of the amplifier (800) of FIG. 8, the switch (815) removes a conduction path to the current in the ladder. In some exemplary embodiments, resistance values of the resistors (R84, R83, R82, R81) can be low enough to allow conduction of a current as large as 0.8 mA, or larger, through the ladder.

Figure 9A:
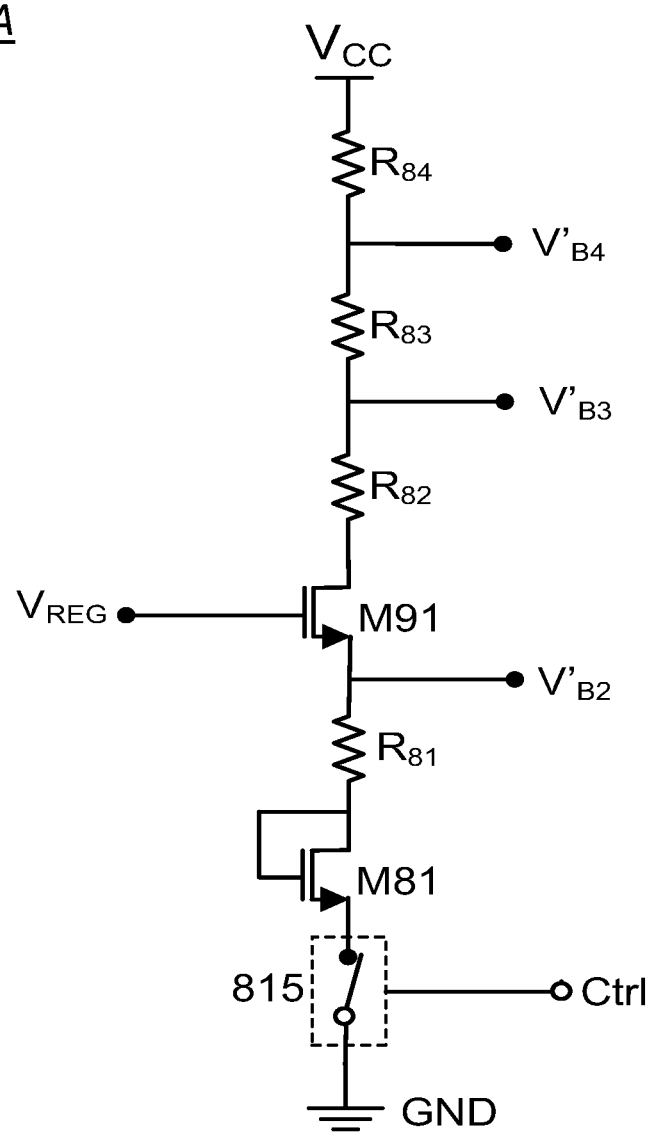
FIG. 9A shows a resistive ladder network according to an embodiment of the present disclosure which may be used in the switchable biasing circuit of FIG. 8, comprising a voltage limiter.

FIG. 9A shows an alternative embodiment of the resistive ladder network (R84, R83, R82, R81) of FIG. 8, where an additional transistor, M91, in series connection between the resistors R82 and R81, can be used to force a desired voltage at a node $V'_{B2}$ of the resistive ladder network. The transistor M91 acts as a closed switch when the switch (815) is also closed, however, when the switch (815) is open (standby mode), the transistor M91 acts as a voltage limiter, for both the voltage at the node $V'_{B2}$ and a voltage seen by the switch (815), so that a transistor device coupled to the node $V'_{B2}$ (e.g. switch 315 of FIG. 8) and a transistor device forming the switch (815) (e.g. M92 of FIG. 9B) do not see the full supply voltage ($V_{CC}$) and break down. Node $V'_{B2}$ and the top node of the switch (815), coupled to the transistor M81, see only roughly $V_{REG}$ because M91 with no current (since switch 815 is open) has a $V_{GS}$ of approximately 0 V, thus shielding transistor devices coupled to such nodes from harmful voltage and excess leakage.

Figure 9B:
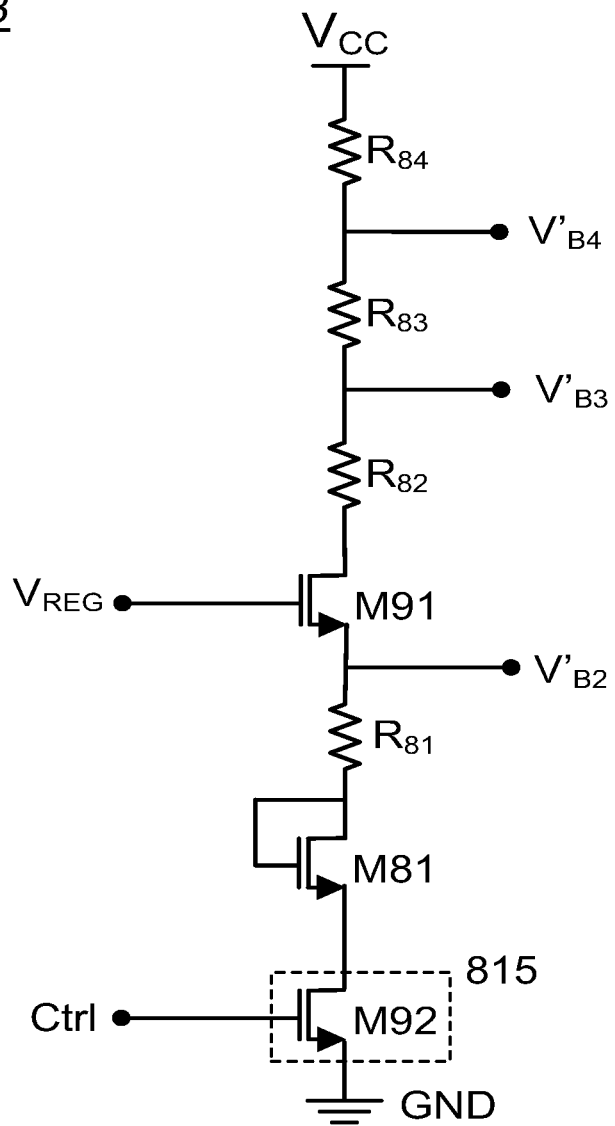
FIG. 9B shows an exemplary embodiment of a switch in the resistive ladder network of FIG. 9A.

FIG. 9B shows the same resistive ladder network according to FIG. 9A where according to an exemplary embodiment, the switch (815) is implemented via a FET transistor M92. A person skilled in the art would know of many different ways to implement the switch (815) as the exemplary embodiment depicted in FIG. 9B should not be considered as limiting the scope of what the applicant considers to be the invention. As discussed above with reference to FIG. 9A, the transistor M91 can protect the transistor M92 from seeing excess voltage and reduce its leakage current when the transistor M92 is not conducting (OFF state).

As discussed above, according to some exemplary embodiments of the present disclosure, voltages at nodes ($V_{B4}$, $V_{B3}$, $V_{B2}$) and nodes ($V'_{B4}$, $V'_{B3}$, $V'_{B2}$) of the resistive ladder networks (R4, R3, R2, R1) and (R84, R83, R82, R81) can be different, so as to bias the gates of the transistors (M4, M3, M2) of the stack differently in the standby mode of operation and the active mode of operation. According to an exemplary embodiment of the present disclosure, a biasing voltage to a gate of a transistor (e.g., M4, M3, M2) in the standby mode of operation is lower than a biasing voltage to the gate of said transistor in the active mode of operation. According to an exemplary embodiment of the present disclosure, the biasing voltage at a gate of each of the transistors (M4, M3, M2) in the standby mode of operation is smaller, by a same constant voltage value, than the biasing voltage at the gate of said transistors in the active mode of operation. According to an exemplary embodiment of the present disclosure, such same constant voltage value can be approximately 0.5 V, such as for all k, $|V_{BK}-V'_{BK}|=\sim 0.5$ V. According to a further embodiment of the present disclosure, a biasing voltage to the gate of a transistor, M2, of the stack, directly coupled to the input transistor, is approximately 0 V in the standby mode of operation. Applicant of the present disclosure have found that by biasing the gates of the transistors of the stack differently in the standby mode of operation, a reduction in the leakage current in the stack (M4, M3, M2, M1) can be obtained. More particularly, such benefits can be obtained by biasing the gate voltages of the stack with lower biasing voltages when compared to the biasing voltages used in the active mode.

Figure 10A:
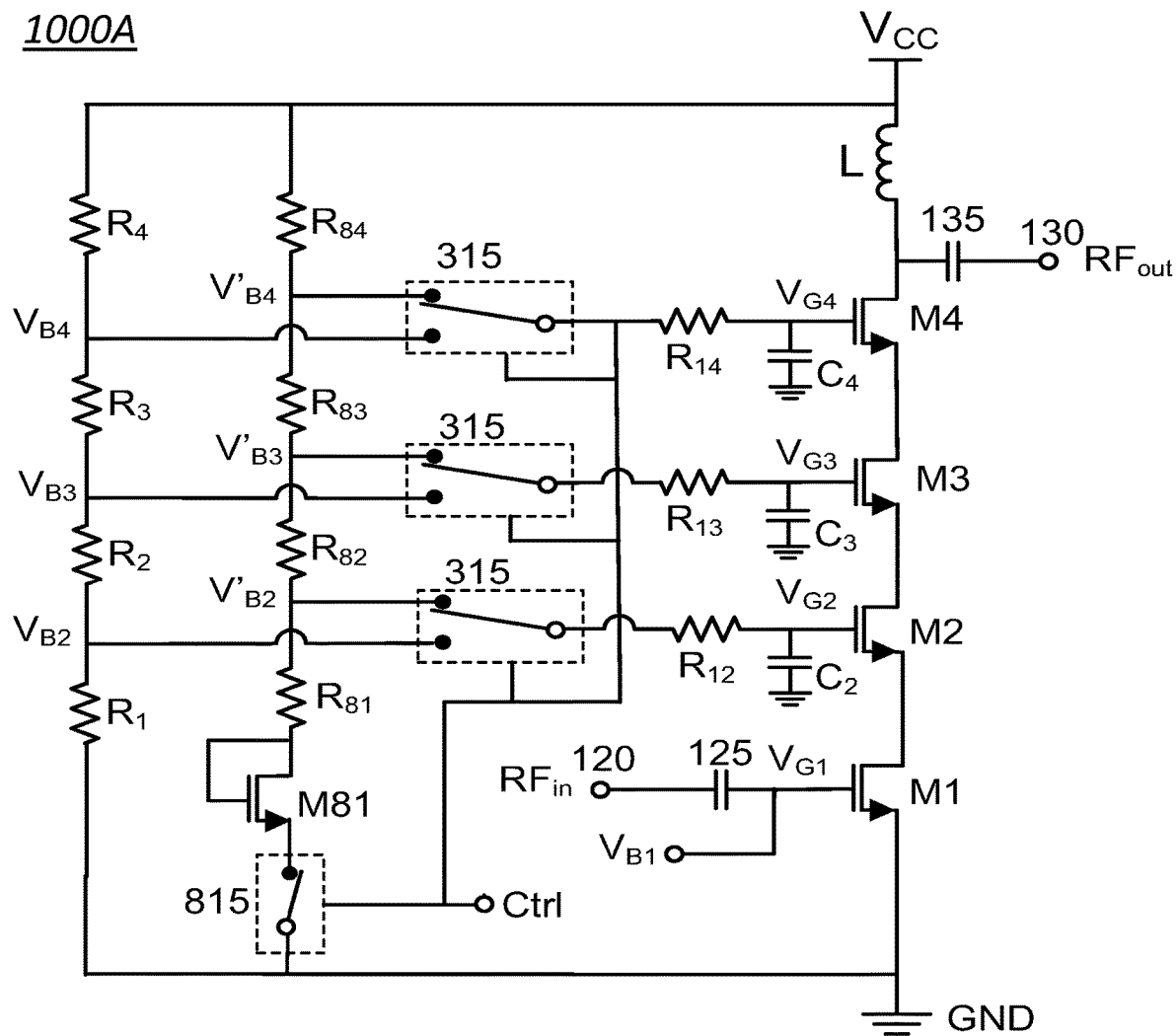
FIG. 10A shows a switchable biasing circuit according to the present disclosure where nodes of two resistive ladder networks provide biasing voltages to transistors of the stack.

FIG. 10A shows an exemplary configuration of an amplifier arrangement (1000A) according to an embodiment of the present disclosure, where voltages at nodes ($V_{B4}$, $V_{B3}$, $V_{B2}$) and nodes ($V'_{B4}$, $V'_{B3}$, $V'_{B2}$) of the resistive ladder networks (R4, R3, R2, R1) and (R84, R83, R82, R81) can be different. According to an exemplary embodiment of the present disclosure voltages at nodes ($V_{B4}$, $V_{B3}$, $V_{B2}$) are smaller than voltages at corresponding nodes ($V'_{B4}$, $V'_{B3}$, $V'_{B2}$) so as to allow a reduction in the leakage current though the stack when in the standby mode. As can be seen in FIG. 10A, the optional diode connected transistor M10 present in the configuration depicted in FIG. 8, has been removed, so as to allow voltage at the lower node $V'_{B2}$ of the resistive ladder network (R4, R3, R2, R1) be further reduced (below the ~0.5 V forward bias voltage of the diode-connected transistor M10 of FIG. 8). Accordingly, in one exemplary embodiment of the amplifier arrangement depicted in FIG. 10A, the voltage at the node $V'_{B2}$ can be approximately 0 V for a reduction in the leakage current (in some cases up to 10× reduction) of the stack (M4, M3, M2, M1).

Figure 10B:
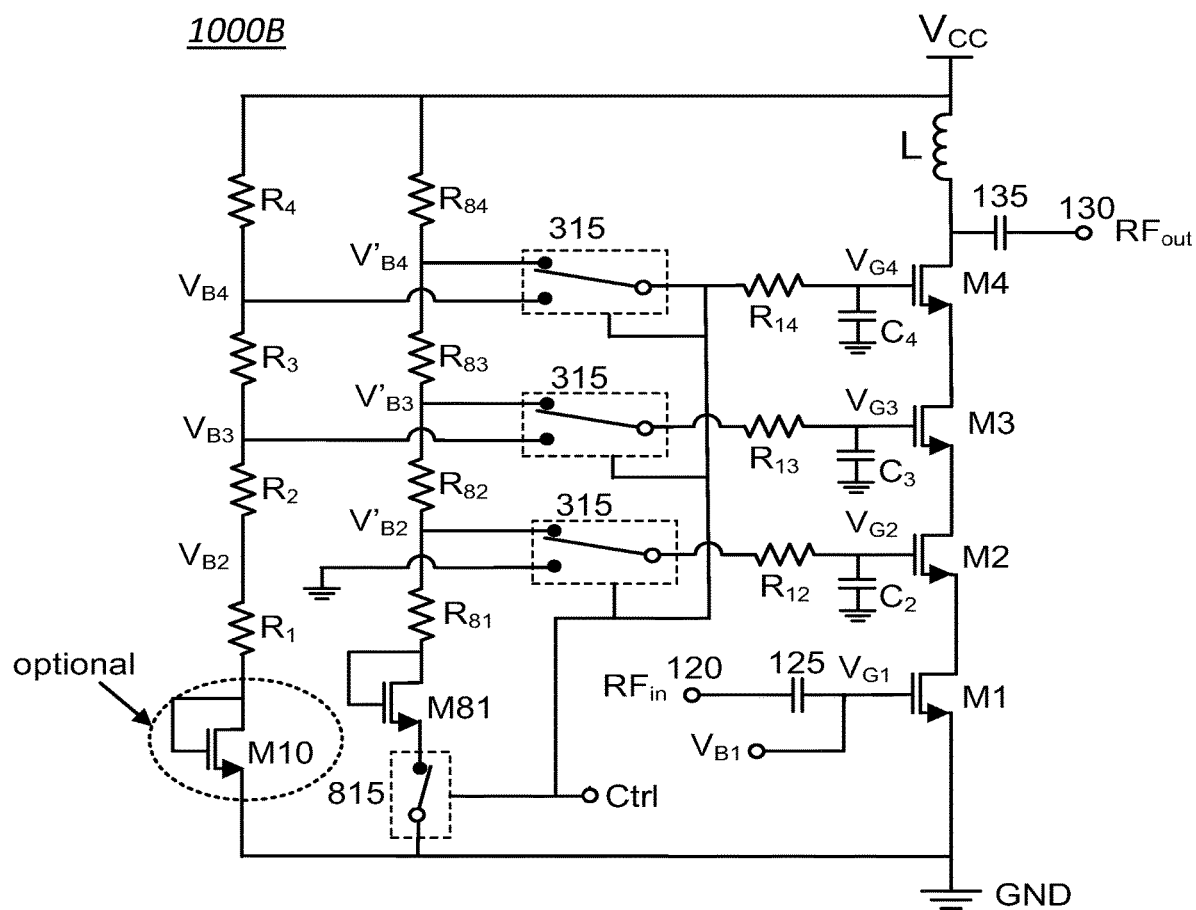
FIG. 10B shows a switchable biasing circuit according to the present disclosure where nodes of two resistive ladder networks provide biasing voltages to some transistors of the stack. A gate of a transistor directly coupled to the input transistor of the stack can be selectively grounded.
Figure 10C:
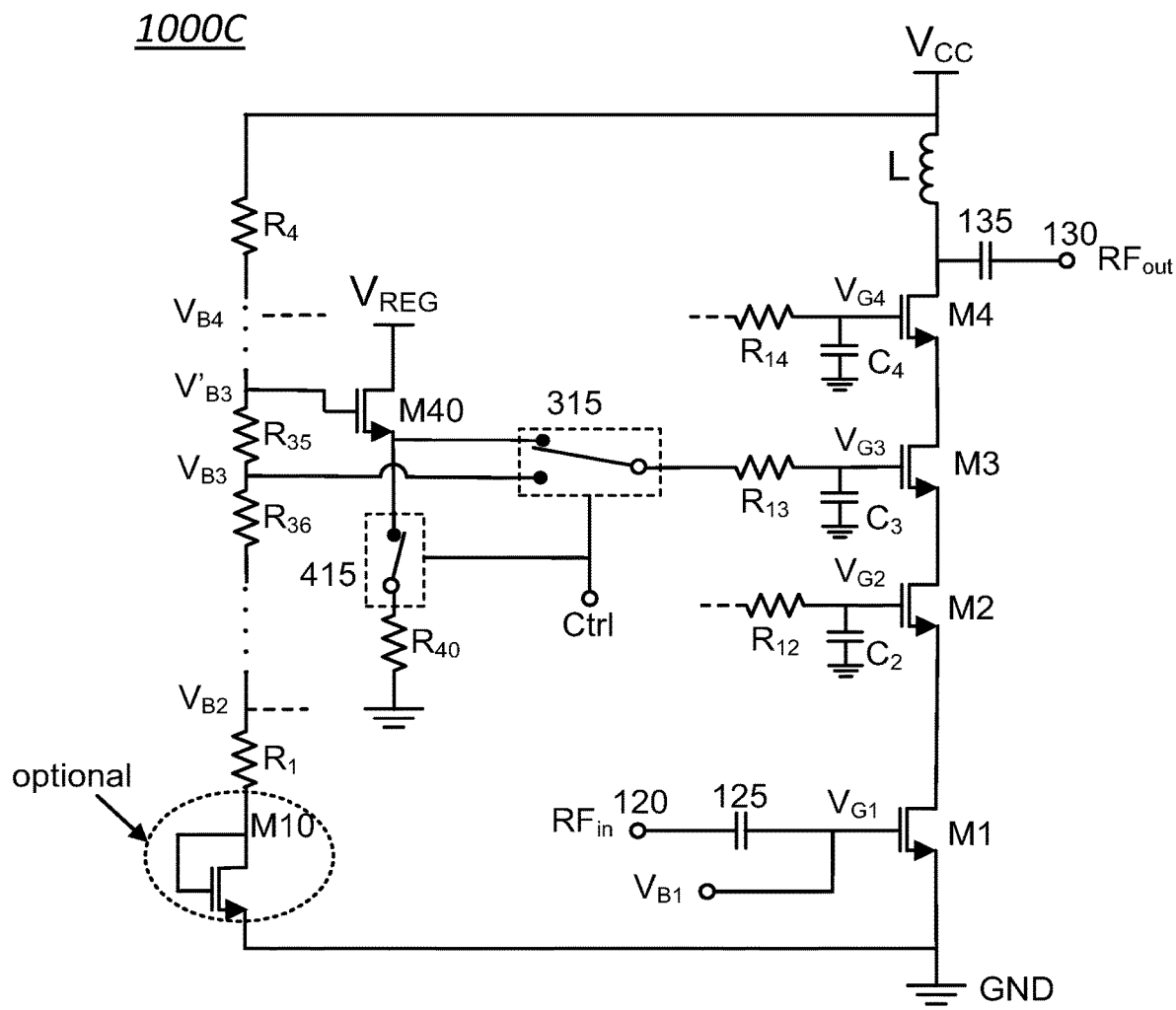
FIG. 10C shows an alternative embodiment according to the present disclosure of the switchable biasing circuit of FIG. 5, where biasing voltages to the transistors of the stack can selectively be different while maintaining proper biasing of the transistors.
Figure 10D:
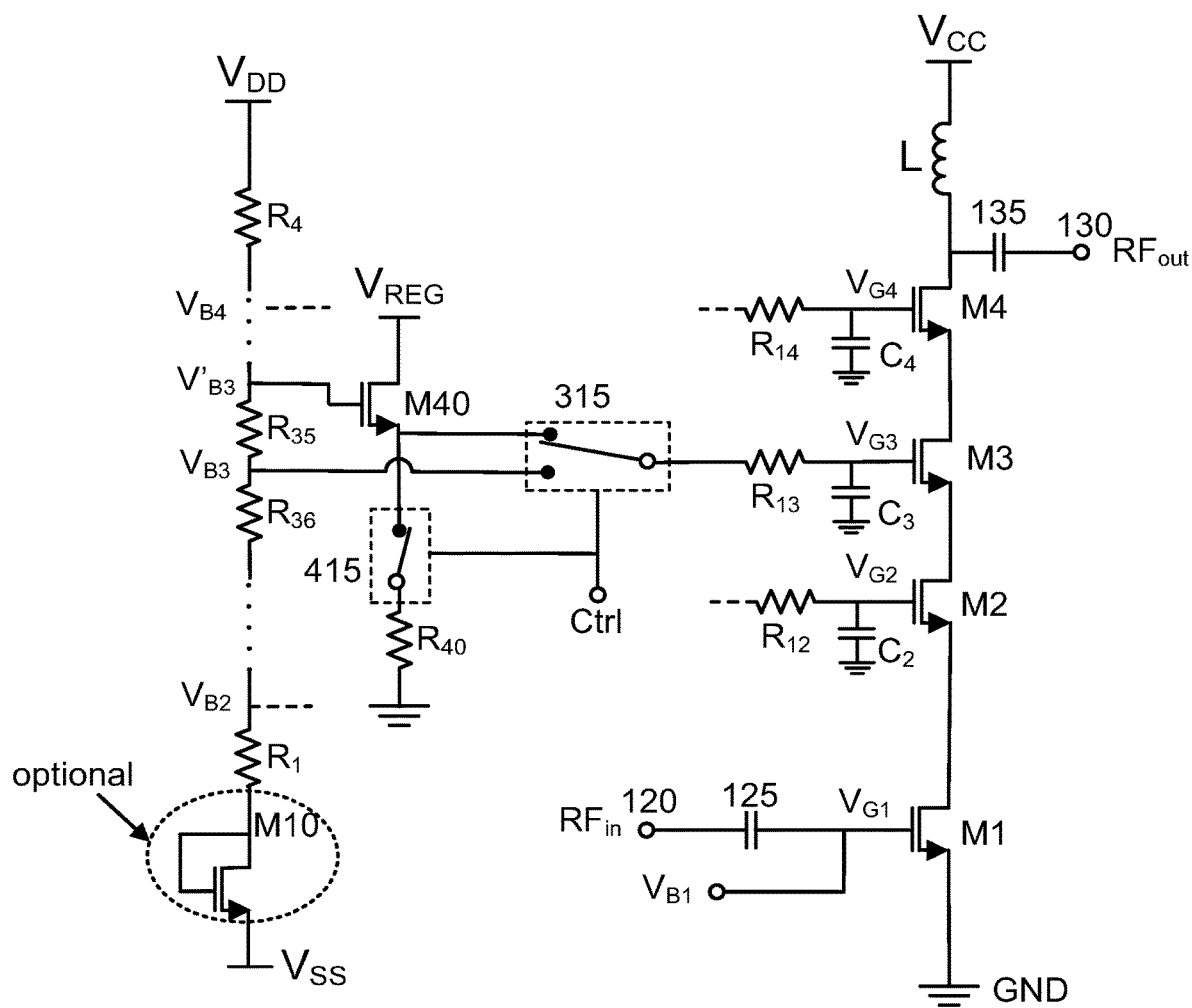
FIG. 10D shows an alternative embodiment according to the present disclosure if the switchable biasing circuit of FIG. 10C, where supply voltage and reference voltage to the resistive ladder network are different from ones provided to the stack.

FIG. 10B shows an alternative embodiment according to the present disclosure, where the where the voltage at the gate node $V_{G2}$ of the transistor M2 is set to 0 V by grounding such gate node via the switch (315). This allows to keep the optional diode-connected transistor M10 in the resistive ladder network (R4, R3, R2, R1) while providing a 0 V to the gate of the transistor M2 in the standby mode for a reduction in the leakage current of the stack (M4, M3, M2, M1). By grounding the gate of the transistor M2 in the standby mode of operation, voltage division of the supply voltage $V_{CC}$ may be assumed mostly by the top transistors M3 and M4. It should be noted that since the transistors of the stack are designed to withstand an RF voltage at the output of the stack (drain of M4), which can be much larger than the supply voltage $V_{CC}$, transistors M3 and M4 may still be able to assume voltage division of the supply voltage $V_{CC}$ in the standby mode where no RF voltage is present.

FIG. 10C shows an alternative embodiment according to the present disclosure, and similar to the embodiment described with respect to FIG. 3, FIG. 5 and FIG. 7, where a single resistive ladder network (R4, R3, R2, R1) coupled to an impedance control unit is used to selectively bias the gates of the transistors (M4, M3, M2) of the stack. Reference voltages for biasing of the gates of the transistors being provided via nodes of the resistive ladder network. In the exemplary case depicted in FIG. 10C, the resistive ladder network is configured to provide different voltage nodes in accordance to the desired different gate biasing voltages for the standby and active modes of operation. For clarity reasons, FIG. 10C shows provision of the gate biasing voltages for one of the transistors (e.g. M3) of the stack. Accordingly, node $V'_{B3}$ of the resistive ladder network, positioned closer to the supply voltage $V_{CC}$, is coupled to the gate of the transistor M40 to selectively provide gate biasing voltage for the transistor M3 in the active mode of operation. Also, node $V_{B3}$ of the resistive ladder network, positioned further from the supply voltage $V_{CC}$, is coupled to the second switching node of the switch (315) to selectively provide gate biasing voltage for the transistor M3 in the standby mode of operation. Since node $V'_{B3}$ is positioned closer to the supply voltage $V_{CC}$ than node $V_{B3}$, gate biasing voltage to the transistor M3 in the active mode of operation (via M40) is larger than one provided in the standby mode of operation. Further details of the functioning of the circuit depicted in FIG. 10C can be found in the above description with respect to FIG. 3, FIG. 5 and FIG. 7.

Figure 10E:
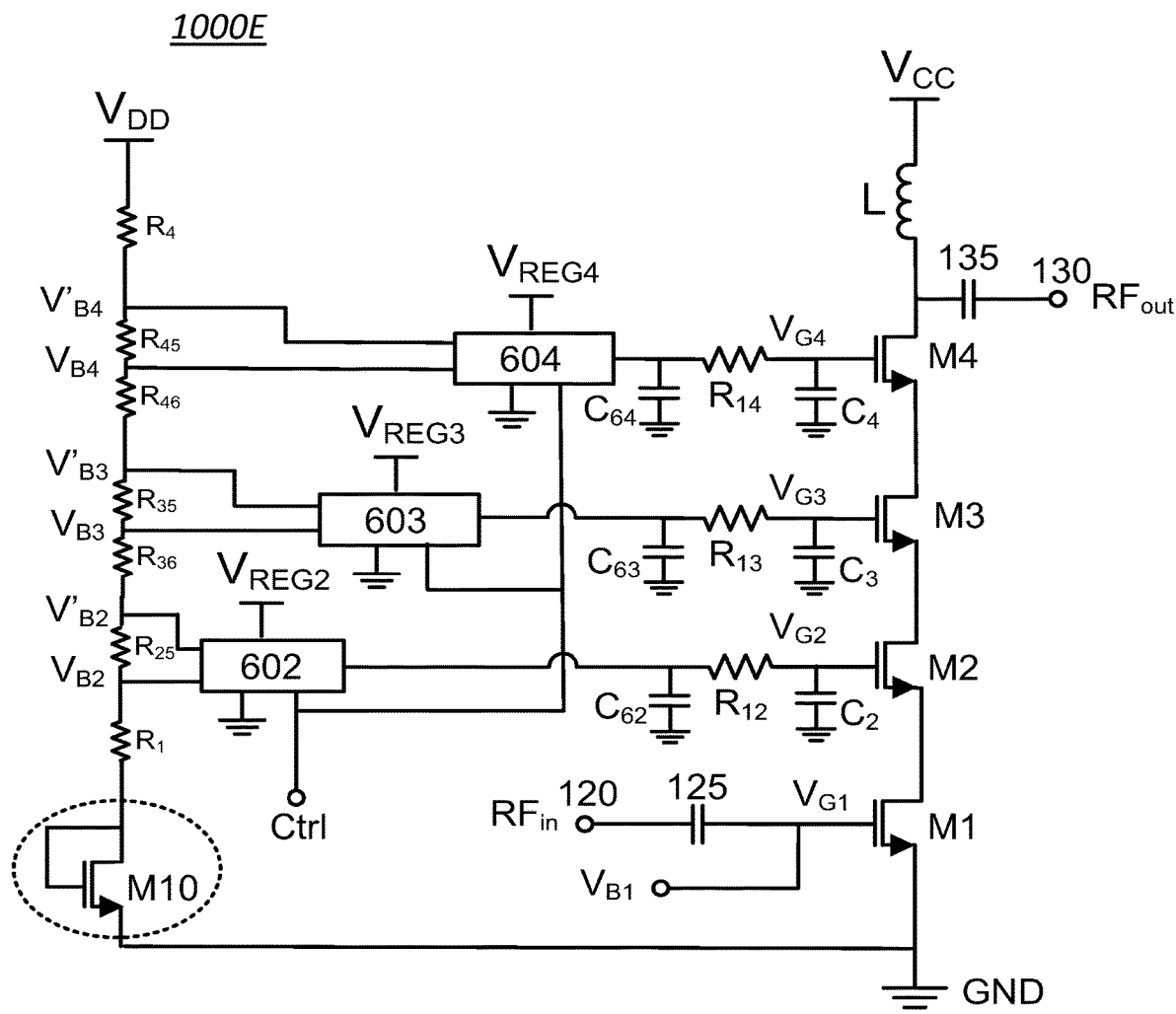
FIG. 10E shows an alternative embodiment according to the present disclosure of the switchable biasing circuit of FIG. 7, where biasing voltages to the transistors of the stack can selectively be different while maintaining proper biasing of the transistors, and where supply voltage and reference voltage to the resistive ladder network are different from ones provided to the stack.

Based on the teaching of the present disclosure, a person skilled in the art may be able to find alternative circuital implementations that allow to selectively bias the transistors of the stack in the standby mode and in the active mode, including biasing with same or different biasing voltages, while presenting a lower impedance to the gates during operation in the active mode, such as to allow a reduction of RF coupling to the biasing circuit and a reduced transition time (faster transient response of the stack). FIG. 10D and FIG. 10E show other exemplary embodiments of the present disclosure where the resistive ladder network is provided with a supply voltage, $V_{DD}$, different from the supply voltage $V_{CC}$ provided to the stack. Such embodiments are based on the embodiments described with respect to FIG. 3, FIG. 5, FIG. 7 and FIGS. 10A-10C.

As shown in FIG. 10D, alternatively or additionally, a reference voltage, $V_{SS}$, to the resistive ladder network may be different from ground (GND). This can allow, for example, generating a gate biasing voltage for M2 in the standby mode that is substantially equal to 0 V in spite of the diode-connected transistor M10 in the resistive ladder network. According to some exemplary embodiment of the present disclosure, the gate biasing voltage for M2 can even be made negative (with respect to GND) such as to bias M2, in the standby mode, to a voltage which puts its gate-to-source voltage further away from its threshold voltage ($V_{th}$) for even a more reduction in a leakage current. Same can be applied to the biasing of the input transistor, M1, in the standby mode, where a negative biasing voltage can put the gate-to-source voltage of M1 further away from its threshold voltage for even a more reduction in the leakage current. A person skilled in the art would know of other methods of reducing leakage current in the stack during the standby mode of operation, such as, for example, increasing the gate length of the input transistor M1, and/or change doping of the input transistor M1 to increase the threshold voltage (Vth) of the transistor (and therefore farther away from the reference ground). Although such methods can be used to effectively reduce the leakage, they may involve changes in process and foundry which are more involved than the simpler circuital changes described above.

It should be noted that although the above embodiments according to the present disclosure are presented with respect to a stacked transistor amplifier (e.g., 300, 500, 700 . . . ), which is shown to be powered by a fixed supply voltage $V_{CC}$, other configurations of such stack transistor amplifier where the supply voltage is variable can also be envisioned. In some exemplary configurations, the supply voltage can be a voltage regulator, or a DC-DC converter. In further exemplary configurations, the supply voltage can vary under control of an external control signal. In some configurations, the control signal can be a function of an envelope signal of the input RF signal, $RF_{in}$, or the output RF signal, $RF_{out}$. Detailed description of such amplifiers operating from a variable supply voltage can be found, for example, in the above referenced Published US Application No. US 2014/0184336 A1, Published US Application No. 2015/0270806 A1, and U.S. Pat. No. 9,219,445, the disclosures of which are incorporated herein by reference in their entirety. A person skilled in the art would also know of configurations where the supply to the amplifier is in the form of a current source instead of the exemplary voltage source (e.g., $V_{CC}$) discussed in the present disclosure. The teachings according to the present disclosure equally apply to such diverse supply configurations. The exemplary case of a fixed supply discussed in the present disclosure should not be considered as limiting what the applicant considers to be the invention. Furthermore, although an exemplary non-limiting case of a single ended RF amplifier configuration is discussed in the above embodiments, the teachings according to the present disclosure equally apply to other amplifier configurations using stacked transistors, such as, for example, differential configurations. Some such configurations are described in, for example, the above referenced Published US Application No. 2014/0184335 A1, Published US Application No. US 2014/0184336 A1, and Published US Application No. 2014/0184337 A1, whose disclosures are incorporated herein by reference in their entirety.

The term "MOSFET" technically refers to metal-oxide-semiconductors; another synonym for MOSFET is "MISFET", for metal-insulator-semiconductor FET. However, "MOSFET" has become a common label for most types of insulated-gate FETs ("IGFETs"). Despite that, it is well known that the term "metal" in the names MOSFET and MISFET is now often a misnomer because the previously metal gate material is now often a layer of polysilicon (polycrystalline silicon). Similarly, the "oxide" in the name MOSFET can be a misnomer, as different dielectric materials are used with the aim of obtaining strong channels with smaller applied voltages. Accordingly, the term "MOSFET" as used herein is not to be read as literally limited to metal-oxide-semiconductors, but instead includes IGFETs in general.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (in excess of about 10 GHz, and particularly above about 20 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functions without significantly altering the functionality of the disclosed circuits.

The examples set forth above are provided to give those of ordinary skill in the art a complete disclosure and description of how to make and use the embodiments of the gate drivers for stacked transistor amplifiers of the disclosure, and are not intended to limit the scope of what the applicant considers to be the invention. Such embodiments may be, for example, used within mobile handsets for current communication systems (e.g. WCMDA, LTE, WiFi, etc.) wherein amplification of signals with frequency content of above 100 MHz and at power levels of above 50 mW may be required. The skilled person may find other suitable implementations of the presented embodiments.

Modifications of the above-described modes for carrying out the methods and systems herein disclosed that are obvious to persons of skill in the art are intended to be within the scope of the following claims. All patents and publications mentioned in the specification are indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a", "an" and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

A number of embodiments of the disclosure have been described. Nevertheless, it will be understood that various modifications can be made without departing from the spirit and scope of the present disclosure. Accordingly, other embodiments are within the scope of the following claims.

The invention claimed is:

1. A method for biasing a transistor stack, the method comprising:
   during a first mode of operation of the transistor stack, coupling gates of transistors of the stack, except an input transistor of the transistor stack, to low impedance nodes;
   during a second mode of operation of the transistor stack, coupling said gates to high impedance nodes; and based on the coupling during the first mode and the coupling during the second mode, providing a biasing voltage to each of said gates that is substantially same during both the first and second modes of operation, thereby obtaining a substantially same voltage distribution of a voltage across the transistor stack during said first and second modes of operation.

2. The method according to claim 1, wherein:
the second mode of operation is a standby mode, and
the high impedance nodes are provided via nodes of a first resistive ladder network whose series connected resistors have resistance values to provide a current flow through the first resistive ladder network that is as small as 3 µA.

3. The method according to claim 2, wherein:
the first mode of operation is an active mode,
the low impedance nodes are provided via output nodes of impedance converter elements, input nodes of the impedance converter elements coupled to the high impedance nodes, and
the impedance converter elements are configured to convert impedances of the high impedance nodes to lower impedances while passing voltages at respective input nodes to respective output nodes substantially unchanged.

4. The method according to claim 3, wherein the impedance converter elements comprise one or more of: a) a transistor, and b) an operational amplifier.

5. The method according to claim 2, wherein:
the first mode of operation is an active mode,
the low impedance nodes are provided via nodes of a second resistive ladder network whose series connected resistors have resistance values according to desired impedance values of the low impedance nodes, and
voltages at nodes of the first resistive ladder network are substantially same as voltages at nodes of the second resistive ladder network.

6. The method according to claim 2, wherein:
the transistor stack comprises one or more gate capacitors each connected between a gate of a transistor of the transistor stack, except an input transistor of the transistor stack, and a reference voltage.

7. The method according to claim 6, wherein each said one or more gate capacitor is configured to allow a gate voltage at the gate of the transistor to vary along with a radio frequency (RF) voltage at a drain of the transistor.

8. The method according to claim 7, wherein the one or more gate capacitors are configured to substantially equalize an output RF voltage at a drain of an output transistor of the transistor stack across a plurality of transistors of the transistor stack.

9. A circuital arrangement comprising:
a transistor stack configured to operate as an amplifier, the transistor stack comprising a plurality of stacked transistors comprising an input transistor and an output transistor; and
a biasing circuit coupled to one or more gates of the plurality of stacked transistors via respective one or more switches,
wherein the circuital arrangement is configured to operate in at least a first mode and a second mode of operation,
wherein during the first mode of operation, the one or more switches couple the one or more gates to low impedance nodes of the biasing circuit to provide respective biasing voltages, and
wherein during the second mode of operation, the one or more switches couple the one or more gates to high impedance nodes of the biasing circuit to provide respective biasing voltages that are substantially same as the respective biasing voltages provided during the first mode of operation.

10. The circuital arrangement according to claim 9, wherein:
the second mode of operation is a standby mode, and
the biasing circuit comprises a first resistive ladder network that provides the high impedance nodes, the first resistive ladder network comprising series connected resistors having resistance values according to a desired current flow through the first resistive ladder network.

11. The circuital arrangement according to claim 10, wherein:
the first mode of operation is an active mode,
the biasing circuit further comprises impedance converter elements,
the low impedance nodes are provided via output nodes of the impedance converter elements, with input nodes of the impedance converter elements coupled to the high impedance nodes, and
the impedance converter elements are configured to convert impedances of the high impedance nodes to lower impedances while passing voltages at respective input nodes to respective output nodes substantially unchanged.

12. The circuital arrangement according to claim 11, wherein the impedance converter elements comprise one or more of: a) a transistor, and b) an operational amplifier.

13. The circuital arrangement according to claim 10, wherein:
the first mode of operation is an active mode,
the biasing circuit comprises a second resistive ladder network that provides the low impedance nodes, the second resistive ladder network comprising series connected resistors having resistance values according to desired impedance values of the low impedance nodes, and
voltages at nodes of the first resistive ladder network are substantially same as voltages at nodes of the second resistive ladder network.

14. The circuital arrangement according to claim 10, wherein:
the transistor stack comprises one or more gate capacitors each connected between a gate of a transistor of the transistor stack except an input transistor of the transistor stack, and a reference voltage.

15. The circuital arrangement according to claim 14, wherein each said one or more gate capacitor is configured to allow a gate voltage at the gate of the transistor to vary along with a radio frequency (RF) voltage at a drain of the transistor.

16. The circuital arrangement according to claim 15, wherein the one or more gate capacitors are configured to substantially equalize an output RF voltage at a drain of an output transistor of the transistor stack across a plurality of transistors of the transistor stack.

17. The circuital arrangement according to claim 9, wherein the circuital arrangement is monolithically integrated using a fabrication technology comprising one of: a) silicon-on-insulator (SOI) technology, and b) silicon-on-sapphire technology (SOS).

18. An electronic module comprising the circuital arrangement of claim 9.

* * * * *